(12) United States Patent
Oikawa et al.

(10) Patent No.: US 8,877,569 B2
(45) Date of Patent: Nov. 4, 2014

(54) METHOD OF MANUFACTURING THIN FILM TRANSISTOR WITH OXIDE SEMICONDUCTOR USING SPUTTERING METHOD

(75) Inventors: Yoshiaki Oikawa, Tochigi (JP); Hotaka Maruyama, Tochigi (JP); Hiromichi Godo, Isehara (JP); Daisuke Kawae, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 251 days.

(21) Appl. No.: 13/455,425

(22) Filed: Apr. 25, 2012

(65) Prior Publication Data
US 2012/0214276 A1  Aug. 23, 2012

Related U.S. Application Data

(62) Division of application No. 12/695,179, filed on Jan. 28, 2010, now Pat. No. 8,174,021.

(30) Foreign Application Priority Data

Feb. 6, 2009  (JP) ................................ 2009-026482

(51) Int. Cl.
| H01L 21/00 | (2006.01) |
| H01L 21/44 | (2006.01) |
| H01L 29/786 | (2006.01) |
| H01L 27/12 | (2006.01) |
| H01L 21/02 | (2006.01) |

(52) U.S. Cl.
CPC ....... *H01L 29/7869* (2013.01); *H01L 21/02631* (2013.01); *H01L 27/1225* (2013.01); *H01L 27/1214* (2013.01); *H01L 21/02565* (2013.01); *H01L 29/78618* (2013.01)
USPC .... 438/149; 438/104; 438/608; 257/E21.462; 257/E29.273

(58) Field of Classification Search
USPC ......... 438/104, 149, 478, 479, 493, 584, 585, 438/590, 591, 608, FOR. 184, FOR. 201; 257/E21.462, E29.273; 204/192.14, 204/192.15, 192.17, 192.23, 192.25
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 1405898 | 3/2003 |
| EP | 1 737 044 A | 12/2006 |

(Continued)

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

(Continued)

*Primary Examiner* — Thanh V Pham
(74) *Attorney, Agent, or Firm* — Eric J. Robinson; Robinson Intellectual Property Law Office, P.C.

(57) ABSTRACT

An object is to provide a semiconductor device provided with a thin film transistor having excellent electric characteristics using an oxide semiconductor layer. An In—Sn—O-based oxide semiconductor layer including $SiO_X$ is used for a channel formation region. In order to reduce contact resistance between the In—Sn—O-based oxide semiconductor layer including $SiO_X$ and a wiring layer formed from a metal material having low electric resistance, a source region or drain region is formed between a source electrode layer or drain electrode layer and the In—Sn—O-based oxide semiconductor layer including $SiO_X$. The source region or drain region and a pixel region are formed using an In—Sn—O-based oxide semiconductor layer which does not include $SiO_X$.

14 Claims, 36 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,291,967 B2 | 11/2007 | Sakata et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 7,956,361 B2 | 6/2011 | Iwasaki |
| 8,148,721 B2 * | 4/2012 | Hayashi et al. ............... 257/43 |
| 8,154,024 B2 | 4/2012 | Iwasaki |
| 8,193,045 B2 | 6/2012 | Omura et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1 | 2/2005 | Hosono et al. |
| 2005/0067953 A1 | 3/2005 | Yamazaki et al. |
| 2005/0127380 A1 | 6/2005 | Kawasaki et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 * | 8/2006 | Isa et al. ............... 257/775 |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0259466 A1 | 11/2007 | Sakata et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0072435 A1 * | 3/2010 | Honda et al. ............. 252/519.51 |
| 2010/0092800 A1 | 4/2010 | Itagaki et al. |
| 2010/0109002 A1 | 5/2010 | Itagaki et al. |
| 2013/0277672 A1 | 10/2013 | Sano et al. |

FOREIGN PATENT DOCUMENTS

| | | |
|---|---|---|
| EP | 2 226 847 A | 9/2010 |
| EP | 2339639 A | 6/2011 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-111323 A | 4/1992 |
| JP | 05-251705 A | 9/1993 |
| JP | 06-139844 A | 5/1994 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2006-165529 A | 6/2006 |
| JP | 2007-103918 A | 4/2007 |
| JP | 2007-123699 A | 5/2007 |
| WO | WO 2004/114391 | 12/2004 |
| WO | WO-2006/051993 | 5/2006 |
| WO | WO-2007/029844 | 3/2007 |
| WO | WO-2008/149873 | 12/2008 |

OTHER PUBLICATIONS

Nakamura et al., "The Phase Relations in the $In_2O_3$—$Ga_2ZnO_4$-ZnO System at 1350° C," Journal of Solid State Chemistry, 1991, vol. 93, pp. 298-315.

Kimizuka et al., "Syntheses and Single-Crystal Data of Homologous Compounds, $In_2O_3(ZnO)_m$ ($m$ = 3, 4, and 5), $InGaO_3(ZnO)_3$, and

(56) References Cited

OTHER PUBLICATIONS $Ga_2O_3(ZnO)_m$ ($m$ = 7, 8, 9, and 16) in the $In_2O_3$—$ZnGa_2O_4$—$ZnO$ System," Journal of Solid State Chemistry, 1995, vol. 116, pp. 170-178.
Nomura et al., "Thin-Film Transistor Fabricated in Single-Crystalline Transparent Oxide Semiconductor," SCIENCE, May 23, 2003, vol. 300, pp. 1269-1272.
Nomura et al., "Room-Temperature Fabrication of Transparent Flexible Thin-Film Transistors Using Amorphous Oxide Semiconductors," NATURE, Nov. 25, 2004, vol. 432, pp. 488-492.
Fortunato et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.
Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.
Ikeda et al., "Full-Functional System Liquid Crystal Display Using CG-Silicon Technology," SID Digest '04: SID International Symposium Digest of Technical Papers, 2004, vol. 35, pp. 860-863.
Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.
Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.
Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.
Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.
Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.
Li et al., "Modulated Structures of Homologous Compounds $InMO_3(ZnO)_m$ ($M$=In,Ga; $m$=Integer) Described by Four-Dimensional Superspace Group," Journal of Solid State Chemistry, 1998, vol. 139, pp. 347-355.
Son et al., "42.4L: Late-News Paper: 4 Inch QVGA AMOLED Driven by the Threshold Voltage Controlled Amorphous GIZO ($Ga_2O_3$—$In_2O_3$—$ZnO$) TFT," SID Digest '08: SID International Symposium Digest of Technical Papers, May 20, 2008, vol. 39, pp. 633-636.
Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.
Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.
Kanno et al., "White Stacked Electrophosphorecent Organic Light-Emitting Devices Employing $MoO_3$ as a Charge-Generation Layer," Adv. Mater. (Advanced Materials), 2006, vol. 18, No. 18, No. 3, pp. 339-342.
Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.
Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Park et al., "High performance amorphous oxide thin film transistors with self-aligned top-gate structure," IEDM 09: Technical Digest of International Electron Devices Meeting, Dec. 7, 2009, pp. 191-194.
Kurokawa et al., "UHF RFCPUs on Flexible and Glass Substrates for Secure RFID Systems," Journal of Solid-State Circuits, 2008, vol. 43, No. 1, pp. 292-299.
Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.
Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.
Lee et al., "15.4: Excellent Performance of Indium-Oxide-Based Thin-Film Transistors by DC Sputtering," SID Digest '09: SID International Symposium Digest of Technical Paper, May 31, 2009, pp. 191-193.
Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Sakata et al., "Development of 4.0-In. AMOLED Display with Driver Circuit Using Amorphous In—Ga—Zn—Oxide TFTs," IDW '09: Proceedings of the 16th International Display Workshops, 2009, pp. 689-692.
Park et al., "Amorphous Indium-Gallium-Zinc Oxide TFTs and their Application for Large Size AMOLED," AM-FPD '08 Digest of Technical Papers, Jul. 2, 2008, pp. 275-278.
Park et al., "Challenge to Future Displays: Transparent AM-OLED Driven by PEALD Grown ZnO TFT," IMID '07 DIGEST, 2007, pp. 1249-1252.
Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Osada et al., "Development of Driver-Integrated Panel using Amorphous In—Ga—Zn—Oxide TFT," AM-FPD '09 Digest of Technical Papers, Jul. 1, 2009, pp. 33-36.
Hirao et al., "Novel Top-Gate Zinc Oxide Thin-Film Transistors (ZnO TFTs) for AMLCDs," Journal of the SID, 2007, vol. 15, No. 1, pp. 17-22.
Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.
Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.
Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.
Miyasaka, "58.2: Invited Paper: Suftla Flexible Microelectronics on their Way to Business," SID Digest '07: SID International Symposium Digest of Technical Papers, 2007, vol. 38, pp. 1673-1676.
Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(56) References Cited

OTHER PUBLICATIONS

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, YbFe2O4, and Yb2Fe3O7 Types of Structures for Compounds in the In2O3 and Sc2O3—A2O3—BO Systems [A: Fe, Ga, Or Al; B: Mg, Mn, Fe, Ni, Cu, or Zn] at Temperatures Over 1000° C" Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent InGaZnO4," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245-202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the $6^{th}$ International Display Workshops, Dec. 3, 2008, pp. 581-584.

Kim et al., "High-Performance oxide thin film transistors passivated by various gas plasmas," $214^{th}$ ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Nakamura, et al., "Syntheses and Crystal Structures of New Homologous Compounds, Indium Iron Zinc Oxides $(InFeO_3(ZnO)_m)$ (m: natural number) and Related Compounds," Kotai Butsuri (Solid State Physics), 1993, vol. 28, No. 5, pp. 317-327.

Chinese Office Action (Application No. 201010116559.2) Dated Sep. 29, 2013.

Chinese Office Action (Application No. 201010116559.2) Dated May 26, 2014.

\* cited by examiner

FIG. 11A1
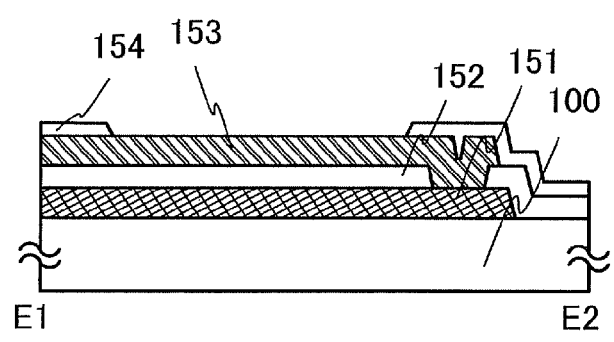
FIG. 11A2
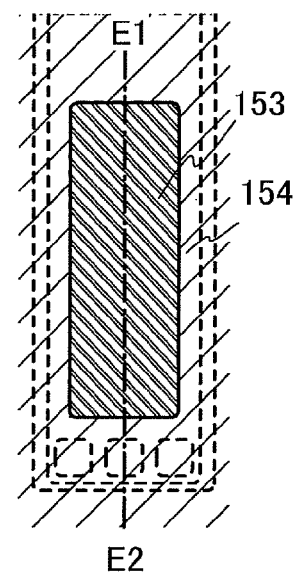
FIG. 11B1
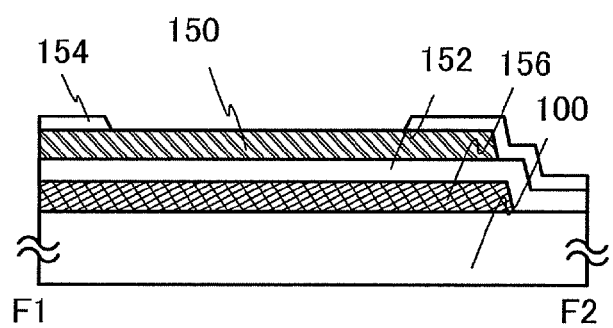
FIG. 11B2
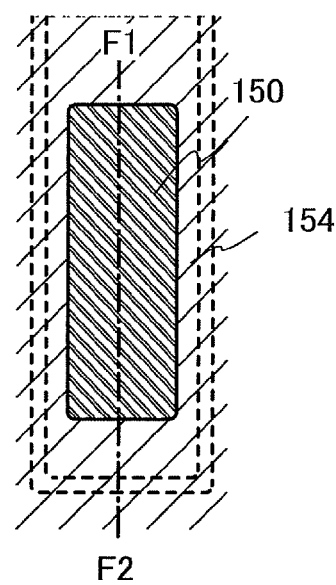

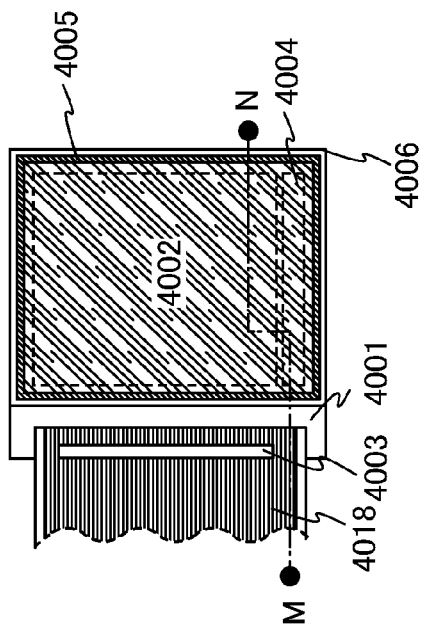
FIG. 22A1
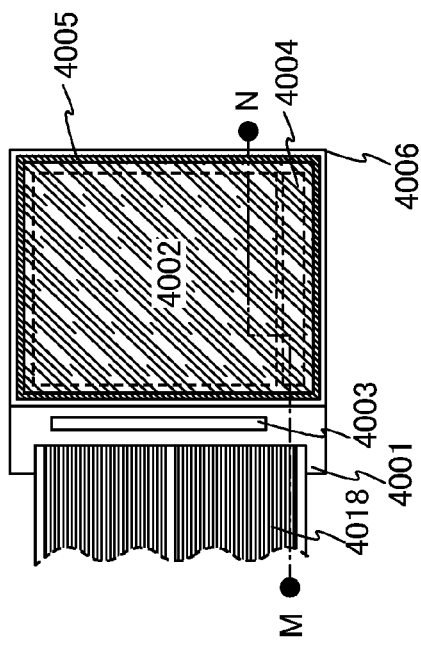
FIG. 22A2
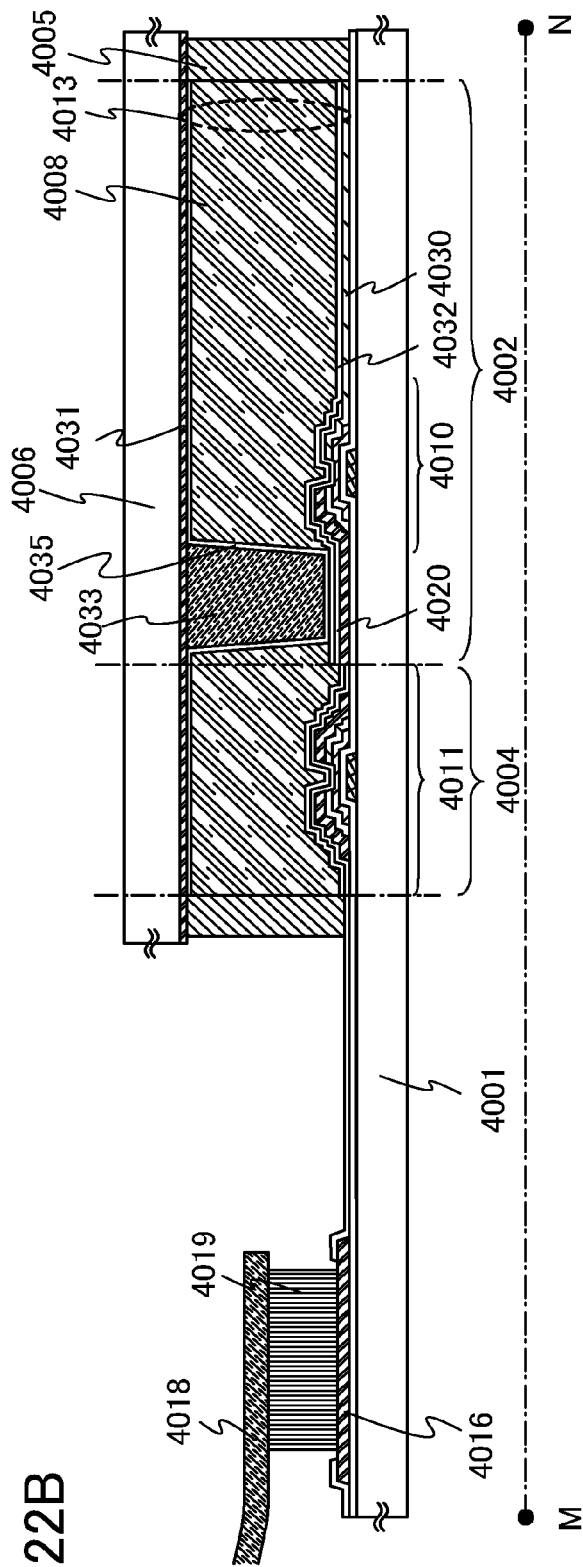
FIG. 22B

METHOD OF MANUFACTURING THIN FILM TRANSISTOR WITH OXIDE SEMICONDUCTOR USING SPUTTERING METHOD

BACKGROUND OF THE INVENTION

1. Field of the Invention

The present invention relates to a semiconductor device including an oxide semiconductor, and a method of manufacturing the semiconductor device.

2. Description of the Related Art

Various metal oxides are used for a variety of applications. Indium oxide is a well-known material and is used as a transparent electrode material which is necessary for liquid crystal displays and the like.

Some metal oxides have semiconductor characteristics. Metal oxides having semiconductor characteristics are a kind of compound semiconductor. The compound semiconductor is a semiconductor formed using two or more kinds of atoms bonded together. In general, metal oxides become insulators. However, it is known that metal oxides become semiconductors depending on the combination of elements included in the metal oxides.

For example, it is known that tungsten oxide, tin oxide, indium oxide, zinc oxide, and the like are metal oxides which have semiconductor characteristics. A thin film transistor in which a transparent semiconductor layer which is formed using such a metal oxide serves as a channel formation region is disclosed (see Patent Documents 1 to 4 and Non-Patent Document 1).

Further, not only one-element oxides but also multi-element oxides are known as metal oxides. For example, $InGaO_3(ZnO)_m$ (m is a natural number) which is a homologous compound is a known material (see Non-Patent Documents 2 to 4).

Furthermore, it is confirmed that such an In—Ga—Zn-based oxide is applicable to a channel layer of a thin film transistor (see Patent Document 5 and Non-Patent Documents 5 and 6).

REFERENCE

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Documents

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, p. 3650-3652
[Non-Patent Document 2] M. Nakamura, N. Kimizuka, and T. Mohri, "The Phase Relations in the $In_2O_3$—$Ga_2ZnO_4$—ZnO System at 1350 °C", *J. Solid State Chem.*, 1991, Vol. 93, p. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, p. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m:natural number) and related compounds", *KOTAI BUTSURI(SOLID STATE PHYSICS)*, 1993, Vol. 28, No. 5, p. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, p. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, p. 488-492

SUMMARY OF THE INVENTION

An object of one embodiment of the present invention is to provide a display device provided with a thin film transistor having excellent electric characteristics and a pixel electrode layer, using an oxide semiconductor layer.

In order to obtain an amorphous oxide semiconductor layer, a thin film transistor is manufactured in which an In—Sn—O-based oxide semiconductor layer including silicon oxide or silicon oxynitride is used for a semiconductor layer including a channel formation region. Typically, the In—Sn—O-based oxide semiconductor layer is formed using an In—Sn—O-based oxide semiconductor target including $SiO_2$ at 5 wt % or higher and 50 wt % or lower, or preferably at 10 wt % or higher and 30 wt % or lower to include $SiO_X$ (X>0) which interrupts crystallization, so that the thin film transistor is obtained, whose gate threshold voltage at which a channel is formed is positive and as close to 0V as possible.

Computation relating to electrical characteristics of a thin film transistor in which an In—Sn—O-based oxide semiconductor layer including $SiO_X$ was used as a semiconductor layer including a channel formation region was performed. A model of the computation and computation results are described below.

The computation was performed using Atlas produced by Silvaco Data Systems, Inc. The structure of a model of the computation is such an inverted staggered thin film transistor as illustrated in FIG. 35. A gate insulating layer 802 over a gate electrode layer 801 (the work function is 4.7 eV) is formed from a silicon oxynitride layer (the thickness is 100 nm and the relative permittivity is 4.1), a semiconductor layer 803 including a channel formation region is formed from an In—Sn—O-based oxide semiconductor layer (the thickness is 50 nm and the electron affinity is 4.3 eV), wiring layers 804a and 804b are formed from an In—Sn—O-based oxide semiconductor layer (the work function is 4.7 eV), and each of the channel length and the channel width in the channel direction of the semiconductor layer 803 including the channel formation region is 10 μm, and the mobility of an electron and the mobility of a hole are 0.1 cm²/Vs and 0.01 cm²/Vs, respectively.

The conductivity of the semiconductor layer 803 is, as shown in FIG. 32, computed from a donor (carrier) concentration, and the electric characteristics of the thin film transistor are computed in the respective cases where the conductivity is $3.9\times10^{-3}$ S/cm, $1.6\times10^{-3}$ S/cm, $8.8\times10^{-4}$ S/cm, $1.3\times10^{-4}$ S/cm, $1.7\times10^{-7}$ S/cm, $1.9\times10^{-10}$ S/cm, and $8.0\times10^{-12}$ S/cm. Results of computation relating to a voltage between a gate and a source (Vgs [V]) of the thin film transistor and a current between a drain and the source (Ids/W [A/μm]) thereof are shown in FIGS. 33A and 33B. Note that a drain voltage is set to 1 V in FIG. 33A, and the drain voltage is set to 10 V in FIG. 33B. In FIGS. 33A and 33B, the results in the case of each conductivity are shown as follows: the results in the case of $3.9\times10^{-3}$ S/cm are denoted by inverted-triangular dots, those of $1.6\times10^{-3}$ S/cm are denoted by an alternate long and short dashed line, those of $8.8\times10^{-4}$ S/cm are denoted by triangular dots, those of $1.3\times10^{-4}$ S/cm are denoted by a dotted line, those of $1.7\times10^{-7}$ S/cm are denoted by circular dots, those of $1.9\times10^{-10}$ S/cm are denoted by a solid line, and those of $8.0\times10^{-12}$ S/cm are denoted by quadrangular dots.

As shown in FIGS. 33A and 33B, when the conductivity of the semiconductor layer is less than or equal to $1.6\times10^{-3}$ S/cm, switching characteristics as a thin film transistor can be obtained. FIG. 34 shows a relation between the threshold voltage and the conductivity of the thin film transistor. It can be founded, from FIG. 34, that when the conductivity of the semiconductor layer is less than or equal to $1.3\times10^{-4}$ S/cm, the threshold voltage is less than or equal to 0 V approximately, so that the normally-off thin film transistor can be obtained. Therefore, it can be said that in the thin film transistor in which the In—Sn—O-based oxide semiconductor layer including $SiO_X$ is used for the semiconductor layer including the channel formation region, the conductivity of the semiconductor layer is preferably less than or equal to $1.6\times10^{-3}$ S/cm, or more preferably less than or equal to $1.3\times10^{-4}$ S/cm.

In addition, in order to reduce contact resistance between the In—Sn—O-based oxide semiconductor layer including $SiO_X$ and a source and a drain electrode layers which are formed from a metal material having low electric resistance, a source region and a drain region are formed between the source and the drain electrode layers and the In—Sn—O-based oxide semiconductor layer including $SiO_X$. One of the source region and the drain region is formed using the same layer as a pixel electrode region.

An In—Sn—O-based oxide semiconductor layer which does not include $SiO_X$ is used for the source region, the drain region, and the pixel electrode region.

As the material of the source electrode layer or drain electrode layer, an element selected from Al, Cr, Ta, Ti, Mo, and W, an alloy containing any of these elements as its component, an alloy containing a combination of any of these elements, or the like is used.

An embodiment disclosed in this specification is a semiconductor device including a gate electrode layer, a gate insulating layer, a first In—Sn—O-based oxide semiconductor layer including $SiO_X$, a source region and a drain region which are in contact with the first In—Sn—O-based oxide semiconductor layer including $SiO_X$, and a pixel electrode region. In this structure, the source region or the drain region and the pixel electrode region are formed from one layer that is a second In—Sn—O-based oxide semiconductor layer.

Another embodiment disclosed in this specification is a semiconductor device including a gate electrode layer over a substrate having an insulating surface, a gate insulating layer over the gate electrode layer, a first In—Sn—O-based oxide semiconductor layer including $SiO_X$ over the gate insulating layer, a source region and a drain region which are in contact with the first In—Sn—O-based oxide semiconductor layer including $SiO_X$, and a pixel electrode region. In this structure, the source region or the drain region and the pixel electrode region are formed from one layer that is a second In—Sn—O-based oxide semiconductor layer.

In any of the above structures, conductivity of the first In—Sn—O-based oxide semiconductor layer including $SiO_X$ is less than or equal to $1.6\times10^{-3}$ S/cm, or preferably less than or equal to $1.3\times10^{-4}$ S/cm. Note that the first In—Sn—O-based oxide semiconductor layer including $SiO_X$ is formed by a sputtering method using an In—Sn—O-based oxide semiconductor target including $SiO_2$ at 5 wt % or higher and 50 wt % or lower, or preferably at 10 wt % or higher and 30 wt % or lower.

An embodiment of the present invention, which realizes the above structure, is a method of manufacturing a semiconductor device, in which a gate electrode layer is formed over a substrate having an insulating surface, a gate insulating layer is formed over the gate electrode layer, a first oxide semiconductor layer including $SiO_X$ is formed over the gate insulating layer by a sputtering method using a first In—Sn—O-based oxide semiconductor target including $SiO_2$ at 5 wt % or higher and 50 wt % or lower, a source region, a drain region, and a pixel electrode region are formed over the first oxide semiconductor layer including $SiO_X$ by a sputtering method using a second In—Sn—O-based oxide semiconductor target, and the source region, the drain region, and the pixel electrode region are formed from one layer that is the second In—Sn—O-based oxide semiconductor layer.

There is no limitation on the structure of the thin film transistor, and a bottom-gate thin film transistor or a top-gate transistor can be employed.

In this specification, a semiconductor device refers to all types of devices which can function by using semiconductor characteristics. An electro-optical device, a semiconductor circuit, and an electronic device are included in the category of all semiconductor devices.

In addition, it is an object of an embodiment of the present invention to provide a semiconductor device provided with a highly reliable thin film transistor in which an oxide semiconductor layer is used.

BRIEF DESCRIPTION OF THE DRAWINGS

FIGS. 11A1 and 11A2 and FIGS. 11B1 and 11B2 illustrate a semiconductor device.

FIGS. 22A1 and 22A2 and FIG. 22B illustrate a semiconductor device;

DETAILED DESCRIPTION OF THE INVENTION

Figure 1A:
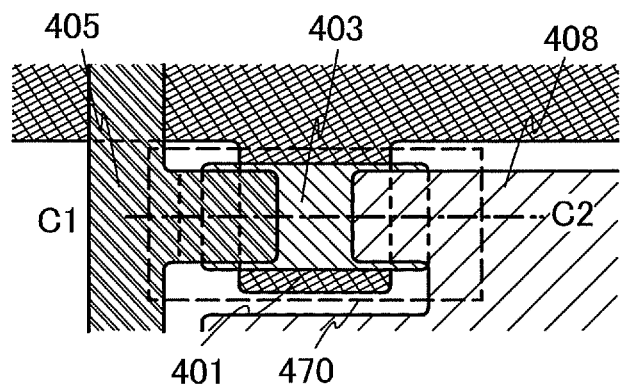
FIGS. 1A and 1B illustrate a semiconductor device.

Embodiments are described with reference to the drawings. However, it is easily understood by those skilled in the art that the modes and details herein disclosed can be modified in a variety of ways without departing from the scope and the spirit of the present invention. Therefore, the present invention is not interpreted as being limited to the description of the embodiments below. In the structures to be given below, the same portions or portions having similar functions are denoted by the same reference numerals in different drawings, and explanation thereof will not be repeated.

[Embodiment 1]

A semiconductor device and a method of manufacturing the semiconductor device will be described with reference to FIGS. 1A and 1B and FIGS. 2A to 2E.

Figure 1B:
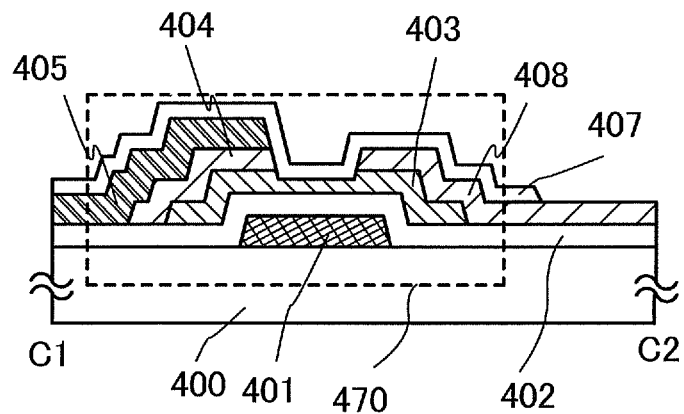

FIG. 1A is a plan view of a thin film transistor 470 included in a semiconductor device, and FIG. 1B is a cross-sectional view taken along line C1-C2 of FIG. 1A. The thin film transistor 470 is an inverted staggered thin film transistor and includes, over a substrate 400 which is a substrate having an insulating surface, a gate electrode layer 401, a gate insulating layer 402, an In—Sn—O-based oxide semiconductor layer 403 including $SiO_X$, an In—Sn—O-based oxide semiconductor layer 404 functioning as a source region or a drain region, an In—Sn—O-based oxide semiconductor layer 408, and a source electrode layer or drain electrode layer 405. In addition, an insulating film 407 is provided to cover the thin film transistor 470 and be in contact with the In—Sn—O-based oxide semiconductor layer 403 including $SiO_X$.

An In—Sn—O-based oxide semiconductor layer including silicon oxide or silicon oxynitride is used for the semiconductor layer including a channel formation region. The conductivity of the In—Sn—O-based oxide semiconductor layer 403 including $SiO_X$ is preferably $1.6\times10^{-3}$ S/cm or less, or more preferably $1.3\times10^{-4}$ S/cm or less. Note that the In—Sn—O-based oxide semiconductor layer 403 including $SiO_X$ is formed by a sputtering method using an In—Sn—O-based oxide semiconductor target including $SiO_2$ at 5 wt % or higher and 50 wt % or lower, or preferably at 10 wt % or higher and 30 wt % or lower.

The In—Sn—O-based oxide semiconductor layer 404 reduces contact resistance. The In—Sn—O-based oxide semiconductor layer 404 is formed as the source region or drain region located between the source electrode layer or drain electrode layer 405 formed from a metal material having low electric resistance and the In—Sn—O-based oxide semiconductor layer 403 including $SiO_X$. One of the source region and the drain region is formed with the In—Sn—O-based oxide semiconductor layer 408 which is the same layer as a pixel electrode region. Therefore, the In—Sn—O-based oxide semiconductor layer 408 has both functions of the source region or the drain region and a pixel electrode.

The In—Sn—O-based oxide semiconductor layer 404 and the In—Sn—O-based oxide semiconductor layer 408 are formed using an In—Sn—O-based oxide semiconductor layer which does not include $SiO_X$. The In—Sn—O-based oxide semiconductor layer 404 and the In—Sn—O-based oxide semiconductor layer 408 largely differ from the In—Sn—O-based oxide semiconductor layer 403 including $SiO_X$ in that they do not include Si. The In—Sn—O-based oxide semiconductor layer 404 and the In—Sn—O-based oxide semiconductor layer 408 can have lower resistance (higher conductivity) than the In—Sn—O-based oxide semiconductor layer 403 including $SiO_X$. An In—Sn—O-based oxide semiconductor to which nitrogen is added may be used for the source region, the drain region, and the pixel electrode region. For example, an In—Sn—O-based non-single-crystal film including nitrogen can be used.

FIGS. 2A to 2E are cross-sectional views illustrating steps of manufacturing the thin film transistor 470.

Figure 2A:
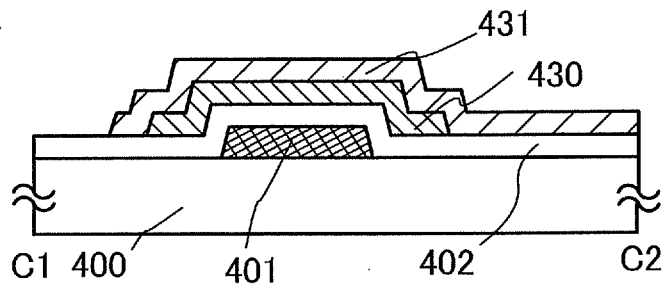
FIGS. 2A to 2E illustrate a method of manufacturing the semiconductor device.
Figure 2B:
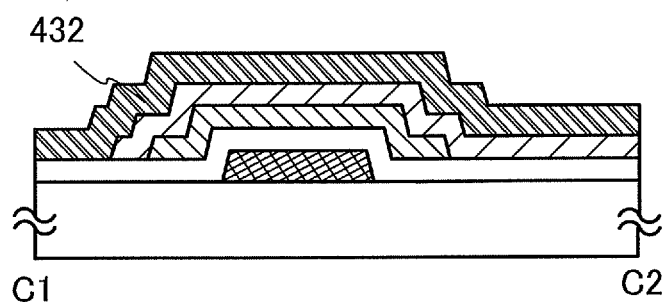

In FIG. 2A, the gate electrode layer 401 is provided over the substrate 400 which is a substrate having an insulating surface. An insulating film serving as a base film may be provided between the substrate 400 and the gate electrode layer 401. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film. The gate electrode layer 401 can be formed with a single-layer or stacked-layer structure using a metal material such as molybdenum, titanium, chromium, tantalum, tungsten, aluminum, copper, neodymium, or scandium, or an alloy material which includes any of these materials as a main component.

For example, as a two-layer structure of the gate electrode layer 401, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a structure in which a tungsten layer or a tungsten nitride layer, a layer of an alloy of aluminum and silicon or an alloy of aluminum and titanium, and a titanium nitride layer or a titanium layer are stacked is preferable.

The gate insulating layer 402 is formed over the gate electrode layer 401.

The gate insulating layer 402 can be formed using a silicon oxide layer, a silicon nitride layer, a silicon oxynitride layer, or a silicon nitride oxide layer to have a single-layer or stacked-layer structure by a plasma CVD method, a sputtering method, or the like. Alternatively, the gate insulating layer 402 can be formed using a silicon oxide layer by a CVD method in which an organosilane gas is used. As the organosilane gas, the following compound containing silicon can be used: tetraethyl orthosilicate tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like.

An In—Sn—O-based oxide semiconductor film 430 including $SiO_X$ and an In—Sn—O-based oxide semiconductor film 431 are formed in this order over the gate insulating layer 402. Each of the In—Sn—O-based oxide semiconductor film 430 including $SiO_X$ and the In—Sn—O-based oxide semiconductor film 431 is processed through a photolithography step so as to be an island-shaped oxide semiconductor layer.

Note that before the In—Sn—O-based oxide semiconductor film 430 including $SiO_X$ is formed by a sputtering method, dust attached to a surface of the gate insulating layer 402 may be removed by plasma treatment in which an argon gas is introduced and plasma is generated.

Figure 2C:
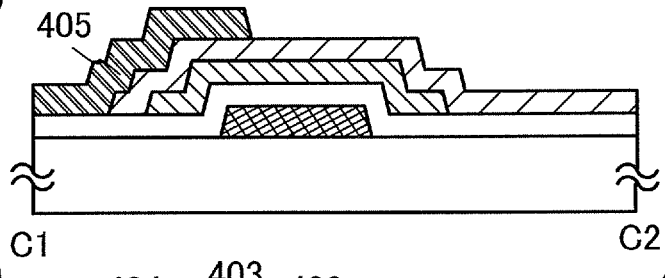
Figure 2D:
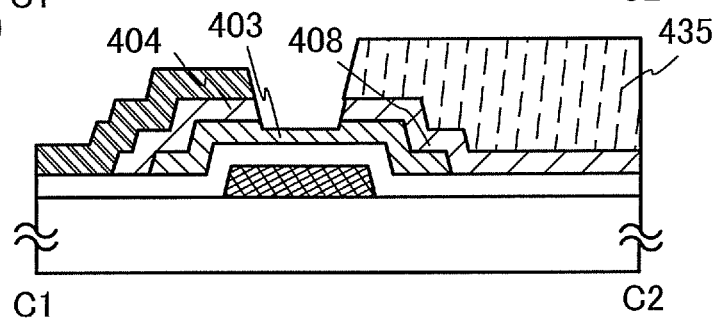

A conductive film 432 is formed over the gate insulating layer 402, the In—Sn—O-based oxide semiconductor film 430 including $SiO_X$, and the In—Sn—O-based oxide semiconductor film 431 (see FIG. 2C).

As the material of the conductive film 432, there are an element selected from Al, Cr, Ta, Ti, Mo, and W; an alloy including any of these elements as its component; an alloy including a combination of any of these elements; and the like. Alternatively, an alloy film in which Al (aluminum) and Nd (neodymium) or Sc (scandium) may be used.

The conductive film 432 is etched through an etching step to form the source electrode layer or drain electrode layer 405 (see FIG. 2C).

A mask 435 is formed over the In—Sn—O-based oxide semiconductor film 431 which does not include $SiO_X$. The In—Sn—O-based oxide semiconductor film 430 including $SiO_X$ and the In—Sn—O-based oxide semiconductor film 431 are etched using the source electrode layer or drain electrode layer 405 and the mask 435 to form the In—Sn—O-based oxide semiconductor layer 403 including $SiO_X$, the In—Sn—O-based oxide semiconductor layer 404, and the In—Sn—O-based oxide semiconductor layer 408 (see FIG. 2D). Note that the In—Sn—O-based oxide semiconductor layer 403 including $SiO_X$ is partly etched so as to become a semiconductor layer including a groove (a recessed portion). The In—Sn—O-based oxide semiconductor layer 404 functions as the source region or the drain region, and the In—Sn—O-based oxide semiconductor layer 408 functions as the source region or drain region and the pixel electrode.

Figure 2E:
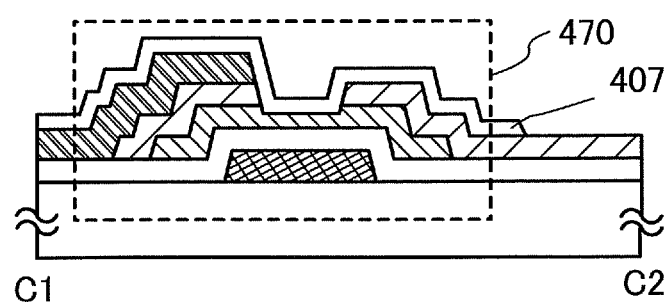

Through the above process, the inverted staggered thin film transistor 470 illustrated in FIG. 2E, in which the In—Sn—O-based oxide semiconductor layer 403 including $SiO_X$ serves as the channel formation region can be manufactured. In addition, the insulating film 407 which covers the thin film transistor 470 and is in contact with the In—Sn—O-based oxide semiconductor layer 403 including $SiO_X$ is formed so as not to cover the pixel electrode region of the In—Sn—O-based oxide semiconductor layer 408.

The insulating film 407 can be formed using a single layer or a stacked layer of a silicon nitride film, a silicon oxide film, and a silicon oxynitride film, which are/is obtained by a sputtering method or the like.

Accordingly, a semiconductor device provided with a thin film transistor having excellent characteristics and a pixel electrode layer can be realized.

[Embodiment 2]

In this embodiment, an example of a semiconductor device including the thin film transistor of Embodiment 1 which is provided with a channel protective layer will be described with reference to FIGS. 3A and 3B and FIGS. 4A to 4E. Therefore, the other parts can be made in a similar manner to Embodiment 1, and the same parts or parts having similar functions, or steps for making such parts are not repeatedly described.

Figure 3A:
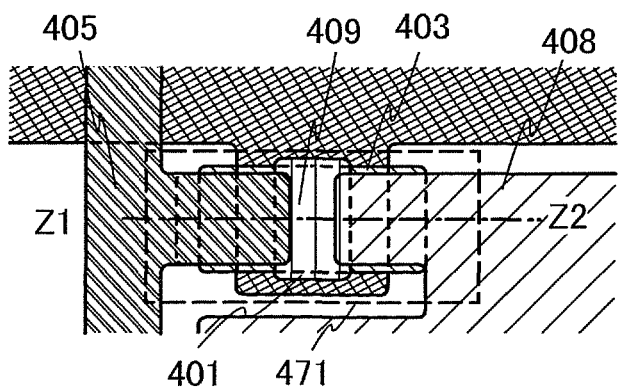
FIGS. 3A and 3B illustrate a semiconductor device.
Figure 3B:
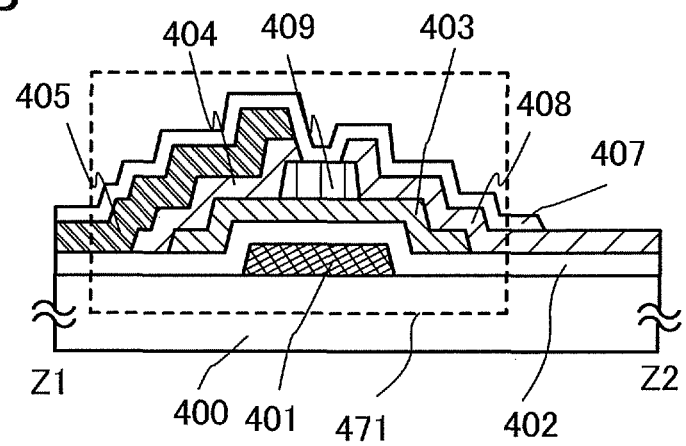

FIG. 3A is a plan view of a thin film transistor 471 included in a semiconductor device, and FIG. 3B is a cross-sectional view taken along line Z1-Z2 of FIG. 3A. The thin film transistor 471 is an inverted staggered thin film transistor and includes, over a substrate 400 which is a substrate having an insulating surface, a gate electrode layer 401, a gate insulating layer 402, an In—Sn—O-based oxide semiconductor layer 403 including $SiO_X$, a channel protective layer 409, an In—Sn—O-based oxide semiconductor layer 404 functioning as a source region or a drain region, an In—Sn—O-based oxide semiconductor layer 408, and a source electrode layer or drain electrode layer 405. In addition, an insulating film 407 is provided to cover the thin film transistor 471. The insulating film 407 is formed so as not to cover the pixel electrode region of the In—Sn—O-based oxide semiconductor layer 408.

In the thin film transistor 471 in this embodiment, the channel protective layer 409 is formed over a channel formation region of the In—Sn—O-based oxide semiconductor layer 403 including $SiO_X$. The In—Sn—O-based oxide semiconductor layer 403 is not etched because the channel protective layer 409 functions as a channel stopper.

The channel protective layer 409 can be formed using an inorganic material (such as silicon oxide, silicon nitride, silicon oxynitride, silicon nitride oxide, aluminum oxide, aluminum nitride, aluminum oxynitride, or aluminum nitride oxide). As a formation method, a sputtering method can be used.

An In—Sn—O-based oxide semiconductor layer including silicon oxide or silicon oxynitride is used for a semiconductor layer including a channel formation region. The conductivity of the In—Sn—O-based oxide semiconductor layer 403 including $SiO_X$ is preferably $1.6 \times 10^{-3}$ S/cm or less, or more preferably $1.3 \times 10^{-4}$ S/cm or less. Note that the In—Sn—O-based oxide semiconductor layer 403 including $SiO_X$ is formed by a sputtering method using an In—Sn—O-based oxide semiconductor target including $SiO_2$ at 5 wt % or higher and 50 wt % or lower, or preferably at 10 wt % or higher and 30 wt % or lower.

The In—Sn—O-based oxide semiconductor layer 404 reduces contact resistance. The In—Sn—O-based oxide semiconductor layer 404 is formed as the source region or drain region between the source electrode layer or a drain electrode layer 405 formed from a metal material having low electric resistance and the In—Sn—O-based oxide semiconductor layer 403 including $SiO_X$. One of the source region and the drain region is formed with the In—Sn—O-based oxide semiconductor layer 408 which is the same layer as a pixel electrode region. Therefore, the In—Sn—O-based oxide semiconductor layer 408 has both functions of the source region or the drain region and a pixel electrode.

The In—Sn—O-based oxide semiconductor layer 404 and the In—Sn—O-based oxide semiconductor layer 408 are formed using an In—Sn—O-based oxide semiconductor layer which does not include $SiO_X$.

FIGS. 4A to 4E are cross-sectional views illustrating steps of manufacturing the thin film transistor 471.

Figure 4A:
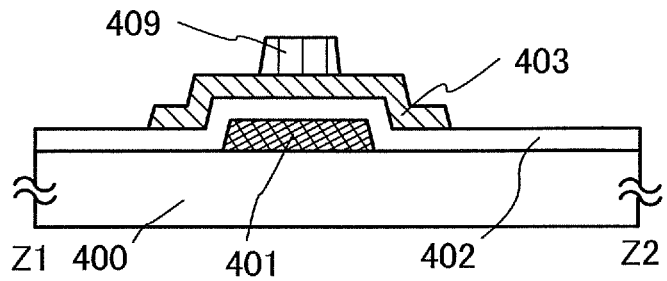
FIGS. 4A to 4E illustrate a method of manufacturing the semiconductor device.

In FIG. 4A, the gate electrode layer 401 is provided over the substrate 400 which is a substrate having an insulating surface. An insulating film serving as a base film may be provided between the substrate 400 and the gate electrode layer 401.

The gate insulating layer 402 is formed over the gate electrode layer 401.

The In—Sn—O-based oxide semiconductor layer 403 including $SiO_X$ and the channel protective layer 409 are formed over the gate insulating layer 402. Each of the In—Sn—O-based oxide semiconductor layer 403 including $SiO_X$ and the channel protective layer 409 is formed through a photolithography step so as to have an island shape.

Figure 4B:
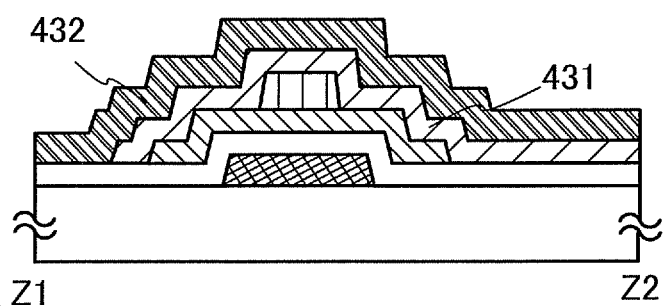

An In—Sn—O-based oxide semiconductor film 431 and a conductive film 432 are formed over the gate insulating layer 402, the In—Sn—O-based oxide semiconductor layer 403 including $SiO_X$, and the channel protective layer 409 (see FIG. 4B).

Figure 4C:
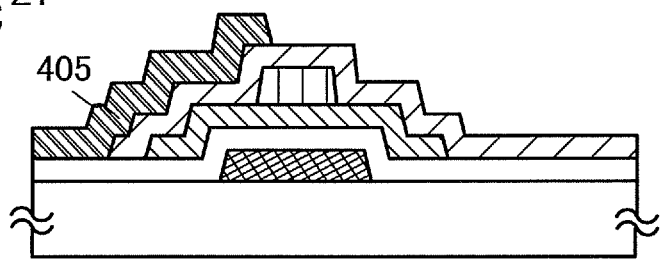
Figure 4D:
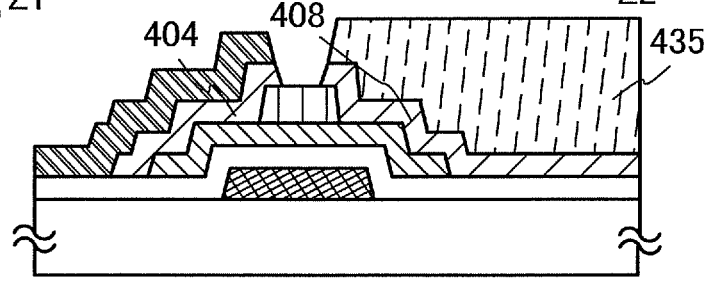

The conductive film 432 is etched through an etching step to form the source electrode layer or drain electrode layer 405 (see FIG. 4C).

A mask 435 is formed over the In—Sn—O-based oxide semiconductor film 431 which does not include $SiO_X$. The In—Sn—O-based oxide semiconductor film 431 is etched using the source electrode layer or drain electrode layer 405 and the mask 435 to form the In—Sn—O-based oxide semiconductor layer 404 and the In—Sn—O-based oxide semiconductor layer 408 (see FIG. 4D). The In—Sn—O-based oxide semiconductor layer 404 functions as the source region or the drain region, and the In—Sn—O-based oxide semiconductor layer 408 functions as the source region or drain region and the pixel electrode.

Figure 4E:
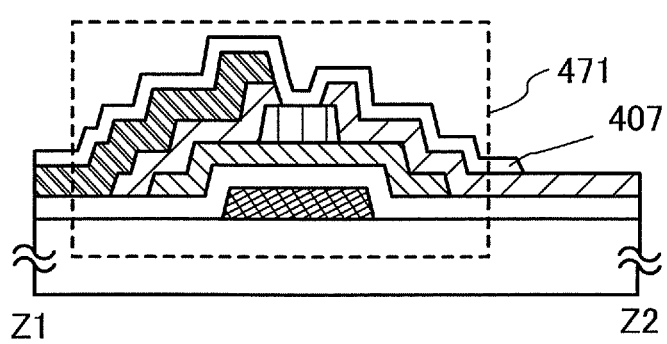

Through the above steps, the inverted staggered thin film transistor 470 as illustrated in FIG. 4E, in which the In—Sn—O-based oxide semiconductor layer 403 including $SiO_X$ serves as the channel formation region can be manufactured. In addition, the insulating film 407 which covers the thin film transistor 470 and is in contact with the channel protective layer 409 is formed so as not cover the pixel electrode region of the In—Sn—O-based oxide semiconductor layer 408.

Accordingly, a semiconductor device provided with a thin film transistor having excellent characteristics and a pixel electrode layer can be realized.

[Embodiment 3]

Another example of a semiconductor device and a method of manufacturing the semiconductor device will be described with reference to FIGS. 5A and 5B and FIGS. 6A to 6E.

Figure 5A:
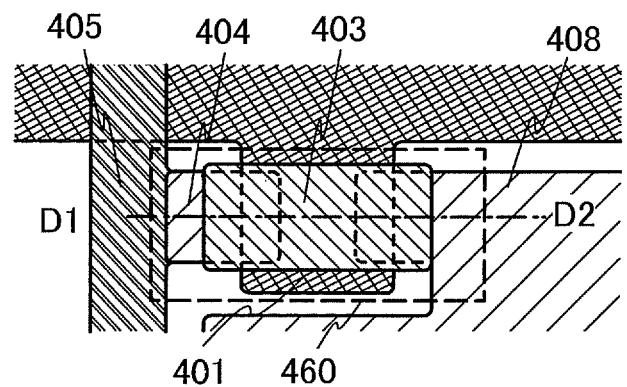
FIGS. 5A and 5B illustrate a semiconductor device.
Figure 5B:
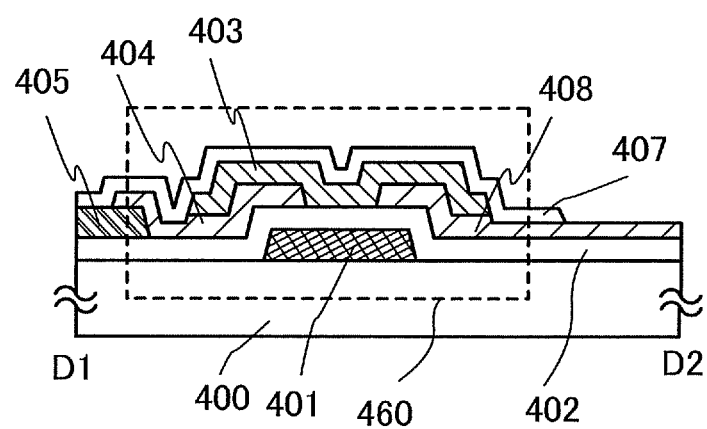

FIG. 5A is a plan view of a thin film transistor 460 included in a semiconductor device, and FIG. 5B is a cross-sectional view taken along line D1-D2 of FIG. 5A. The thin film transistor 460 is a bottom-gate thin film transistor and includes, over a substrate 400 which is a substrate having an insulating surface, a gate electrode layer 401, a gate insulating layer 402, a source electrode layer or drain electrode layer 405, an In—Sn—O-based oxide semiconductor layer 404 functioning as a source region or a drain region, an In—Sn—O-based oxide semiconductor layer 408, and an In—Sn—O-based oxide semiconductor layer 403 including $SiO_X$. In addition, an insulating film 407 is provided to cover the thin film transistor 460 and be in contact with the In—Sn—O-based oxide semiconductor layer 403 including $SiO_X$. The insulating film 407 is formed so as not to cover the pixel electrode region of the In—Sn—O-based oxide semiconductor layer 408.

In the thin film transistor 460, the gate insulating layer 402 exists throughout the region including the thin film transistor 460, and the gate electrode layer 401 is provided between the gate insulating layer 402 and the substrate 400 which is a substrate having an insulating surface. Over the gate insulating layer 402, the source electrode layer or drain electrode layer 405, the In—Sn—O-based oxide semiconductor layer 404, and the In—Sn—O-based oxide semiconductor layer 408 are provided. The In—Sn—O-based oxide semiconductor layer 403 including $SiO_X$ is provided over the gate insulating layer 402, the source electrode layer or drain electrode layer 405, the In—Sn—O-based oxide semiconductor layer 404, and the In—Sn—O-based oxide semiconductor layer 408. Although not illustrated, a wiring layer is provided over the gate insulating layer 402 in addition to the source electrode layer or drain electrode layer 405. The wiring layer extends to the outside of a peripheral portion of the In—Sn—O-based oxide semiconductor layer 403 including $SiO_X$.

An In—Sn—O-based oxide semiconductor layer including silicon oxide or silicon oxynitride is used for a semiconductor layer including a channel formation region. The conductivity of the In—Sn—O-based oxide semiconductor layer 403 including $SiO_X$ is preferably $1.6 \times 10^{-3}$ S/cm or less, or more preferably $1.3 \times 10^{-4}$ S/cm or less. Note that the In—Sn—O-based oxide semiconductor layer 403 including $SiO_X$ is formed by a sputtering method using an In—Sn—O-based oxide semiconductor target including $SiO_2$ at 5 wt % or higher and 50 wt % or lower, or preferably at 10 wt % or higher and 30 wt % or lower.

The In—Sn—O-based oxide semiconductor layer 404 reduces contact resistance. The In—Sn—O-based oxide semiconductor layer 404 is formed as the source region or drain region between the source electrode layer or a drain electrode layer 405 formed from a metal material having low electric resistance and the In—Sn—O-based oxide semiconductor layer 403 including $SiO_X$. One of the source region and the drain region is formed with the In—Sn—O-based oxide semiconductor layer 408 which is the same layer as a pixel electrode region. Therefore, the In—Sn—O-based oxide semiconductor layer 408 has both functions of the source region or the drain region and a pixel electrode.

The In—Sn—O-based oxide semiconductor layer 404 and the In—Sn—O-based oxide semiconductor layer 408 are formed using an In—Sn—O-based oxide semiconductor layer which does not include $SiO_X$.

FIGS. 6A to 6E are cross-sectional views illustrating steps of manufacturing the thin film transistor 460.

The gate electrode layer 401 is provided over the substrate 400 which is a substrate having an insulating surface. An insulating film serving as a base film may be provided between the substrate 400 and the gate electrode layer 401.

The gate insulating layer 402 is formed over the gate electrode layer 401. Then, the source electrode layer or drain electrode layer 405 is formed over the gate insulating layer 452 (see FIG. 6A).

Figure 6A:
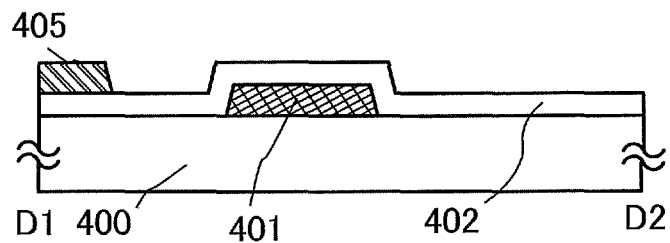
FIGS. 6A to 6E illustrate a method of manufacturing the semiconductor device.
Figure 6B:
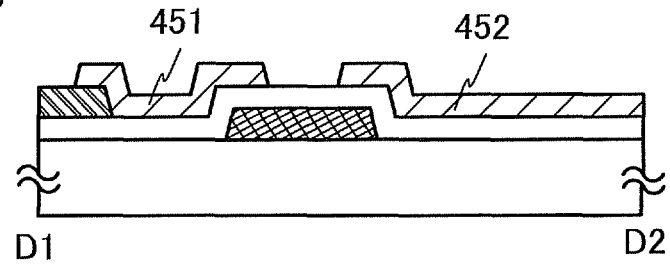

An In—Sn—O-based oxide semiconductor film is formed and processed through a photolithography step to form island-shaped In—Sn—O-based oxide semiconductor films 451 and 452 (see FIG. 6B).

Figure 6C:
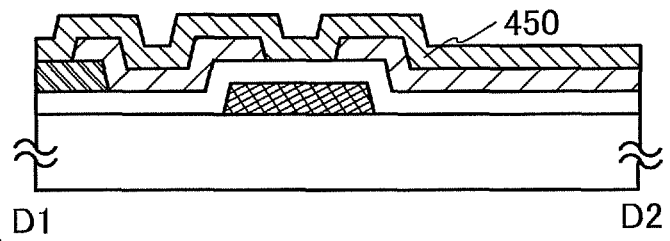

Next, an In—Sn—O-based oxide semiconductor film 450 including $SiO_X$ is formed over the In—Sn—O-based oxide semiconductor films 451 and 452 (see FIG. 6C).

Figure 6D:
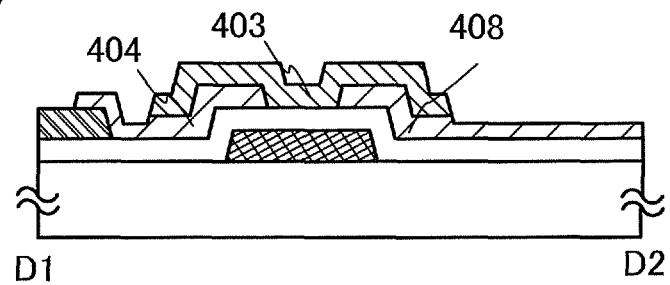

The In—Sn—O-based oxide semiconductor film 450 including $SiO_X$ is processed by etching through a photolithography step to form the island-shaped In—Sn—O-based oxide semiconductor layer 403 including $SiO_X$ (see FIG. 6D). In the etching of the In—Sn—O-based oxide semiconductor film 450, the In—Sn—O-based oxide semiconductor films 451 and 452 are partly etched to be the In—Sn—O-based oxide semiconductor layer 404 and the In—Sn—O-based oxide semiconductor layer 408.

Figure 6E:
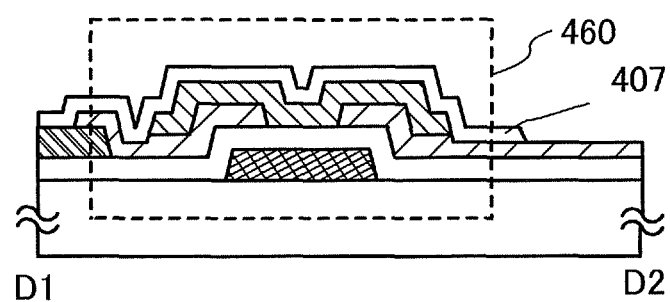

Through the above process, the inverted staggered thin film transistor 460 illustrated in FIG. 6E, in which the In—Sn—O-based oxide semiconductor layer 403 including $SiO_X$ serves as the channel formation region can be manufactured. In addition, the insulating film 407 which covers the thin film transistor 460 and is in contact with the In—Sn—O-based oxide semiconductor layer 403 including $SiO_X$ is formed so as not to cover the pixel electrode region of the In—Sn—O-based oxide semiconductor layer 408.

Accordingly, a semiconductor device provided with a thin film transistor having excellent characteristics and a pixel electrode layer can be realized.

[Embodiment 4]

In this embodiment, an example of a top-gate semiconductor device will be described with reference to FIGS. 7A and 7B.

Figure 7A:
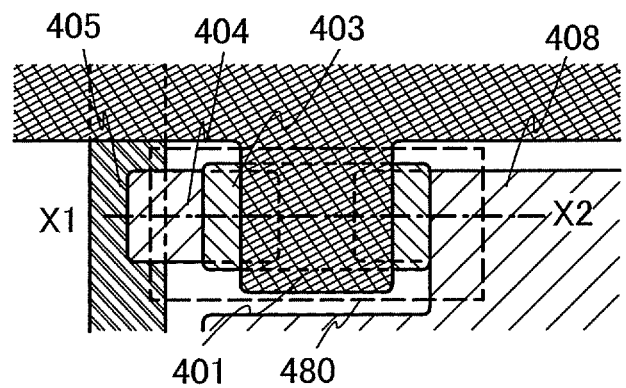
FIGS. 7A and 7B illustrate a semiconductor device.
Figure 7B:
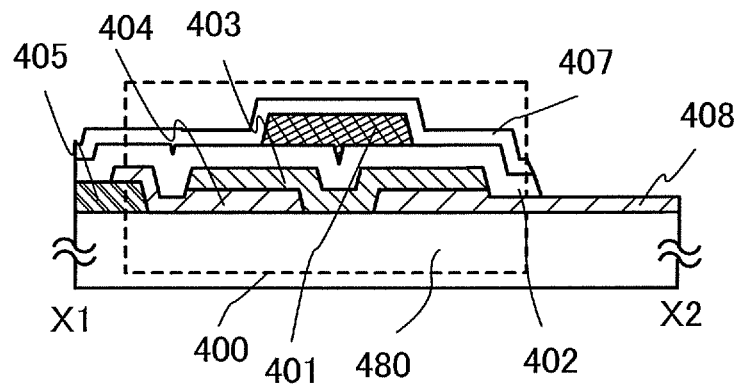

FIG. 7A is a top view of a thin film transistor 480 included in a semiconductor device, and FIG. 7B is a cross-sectional view taken along line X1-X2 of FIG. 7A. The thin film transistor 480 is a top-gate thin film transistor and includes, over a substrate 400 which is a substrate having an insulating surface; a source electrode layer or drain electrode layer 405; an In—Sn—O-based oxide semiconductor layer 404 which functions as a source region or a drain region and is in contact with the source electrode layer or drain electrode layer 405; an In—Sn—O-based oxide semiconductor layer 408; an In—Sn—O-based oxide semiconductor layer 403 including $SiO_X$, which is in contact with the In—Sn—O-based oxide semiconductor layers 404 and 408; a gate insulating layer 402; and a gate electrode layer 401. In addition, an insulating film 407 is provided to cover the thin film transistor 480. The insulating film 407 and the gate insulating layer 402 are formed so as not to cover the pixel electrode region of the In—Sn—O-based oxide semiconductor layer 408.

The thin film transistor 480 has a structure in which the gate insulating layer 402 is formed over the source electrode layer or drain electrode layer 405, the In—Sn—O-based oxide semiconductor layers 404 and 408, and the In—Sn—O-based oxide semiconductor layer 403 including $SiO_X$, and the gate electrode layer 401 is provided over the gate insulating layer 402 to overlap with the In—Sn—O-based oxide semiconductor layers 404 and 408 and the In—Sn—O-based oxide semiconductor layer 403 including $SiO_X$.

An In—Sn—O-based oxide semiconductor layer including silicon oxide or silicon oxynitride is used for a semiconductor layer including a channel formation region. The conductivity of the In—Sn—O-based oxide semiconductor layer 403 including $SiO_X$ is preferably $1.6 \times 10^{-3}$ S/cm or less, or more preferably $1.3 \times 10^{-4}$ S/cm or less. Note that the In—Sn—O-based oxide semiconductor layer 403 including $SiO_X$ is formed by a sputtering method using an In—Sn—O-based oxide semiconductor target including $SiO_2$ at 5 wt % or higher and 50 wt % or lower, or preferably at 10 wt % or higher and 30 wt % or lower.

The In—Sn—O-based oxide semiconductor layer 404 reduces contact resistance. The In—Sn—O-based oxide semiconductor layer 404 is formed as the source region or drain region between the source electrode layer or a drain electrode layer 405 formed from a metal material having low electric resistance and the In—Sn—O-based oxide semiconductor layer 403 including $SiO_X$. One of the source region and the drain region is formed with the In—Sn—O-based oxide semiconductor layer 408 which is the same layer as a pixel electrode region. Therefore, the In—Sn—O-based oxide semiconductor layer 408 has both functions of the source region or the drain region and a pixel electrode.

The In—Sn—O-based oxide semiconductor layer 404 and the In—Sn—O-based oxide semiconductor layer 408 are formed using an In—Sn—O-based oxide semiconductor layer which does not include $SiO_X$.

Accordingly, a semiconductor device provided with a thin film transistor having excellent characteristics and a pixel electrode layer can be realized.

[Embodiment 5]

In this embodiment, another example of a top-gate semiconductor device will be described with reference to FIGS. 8A and 8B.

Figure 8A:
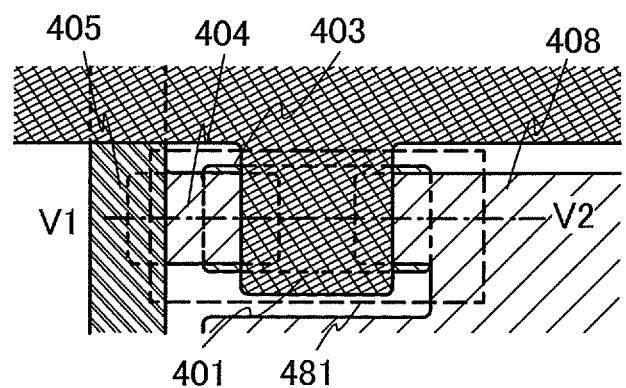
FIGS. 8A and 8B illustrate a semiconductor device.
Figure 8B:
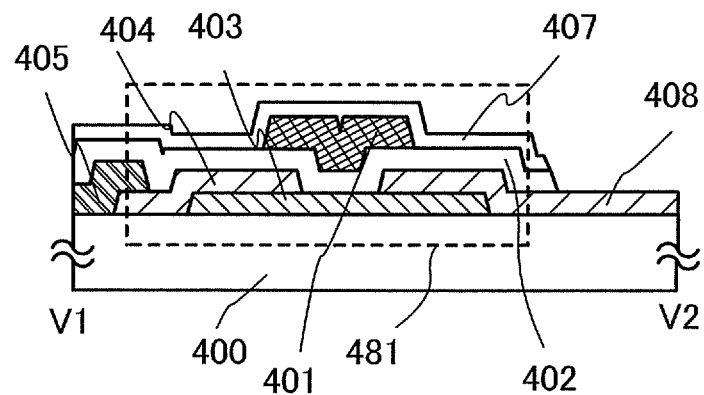

FIG. 8A is a top view of a thin film transistor 481 included in a semiconductor device, and FIG. 8B is a cross-sectional view taken along line V1-V2 of FIG. 8A. The thin film transistor 481 is a top-gate thin film transistor and includes, over a substrate 400 which is a substrate having an insulating surface, an In—Sn—O-based oxide semiconductor layer 403 including $SiO_X$, an In—Sn—O-based oxide semiconductor layer 404 functioning as a source region or a drain region and an In—Sn—O-based oxide semiconductor layer 408 which are in contact with the In—Sn—O-based oxide semiconductor layer 403 including $SiO_X$, a source electrode layer or drain electrode layer 405 in contact with the In—Sn—O-based oxide semiconductor layer 404, a gate insulating layer 402, and a gate electrode layer 401. In addition, an insulating film 407 is provided to cover the thin film transistor 481. The insulating film 407 and the gate insulating layer 402 are formed so as not to cover the pixel electrode region of the In—Sn—O-based oxide semiconductor layer 408.

The thin film transistor 481 has a structure in which the gate insulating layer 402 is formed over the In—Sn—O-based oxide semiconductor layer 403 including $SiO_X$, the In—Sn—O-based oxide semiconductor layer 404, the In—Sn—O-based oxide semiconductor layer 408, and the source electrode layer or drain electrode layer 405, and the gate electrode layer 401 is provided over the gate insulating layer 402 to overlap with the In—Sn—O-based oxide semiconductor layer 403 including $SiO_X$ and the In—Sn—O-based oxide semiconductor layers 404 and 408.

An In—Sn—O-based oxide semiconductor layer including silicon oxide or silicon oxynitride is used for a semiconductor layer including a channel formation region. The conductivity of the In—Sn—O-based oxide semiconductor layer 403 including $SiO_X$ is preferably $1.6 \times 10^{-3}$ S/cm or less, or more preferably $1.3 \times 10^{-4}$ S/cm or less. Note that the In—Sn—O-based oxide semiconductor layer 403 including $SiO_X$ is formed by a sputtering method using an In—Sn—O-based oxide semiconductor target including $SiO_2$ at 5 wt % or higher and 50 wt % or lower, or preferably at 10 wt % or higher and 30 wt % or lower.

The In—Sn—O-based oxide semiconductor layer 404 reduces contact resistance. The In—Sn—O-based oxide semiconductor layer 404 is formed as the source region or drain region between the source electrode layer or a drain electrode layer 405 formed from a metal material having low electric resistance and the In—Sn—O-based oxide semiconductor layer 403 including $SiO_X$. One of the source region and the drain region is formed with the In—Sn—O-based oxide semiconductor layer 408 which is the same layer as a pixel electrode region. Therefore, the In—Sn—O-based oxide semiconductor layer 408 has both functions of the source region or the drain region and a pixel electrode.

The In—Sn—O-based oxide semiconductor layer 404 and the In—Sn—O-based oxide semiconductor layer 408 are formed using an In—Sn—O-based oxide semiconductor layer which does not include SiO$_X$.

Accordingly, a semiconductor device provided with a thin film transistor having excellent characteristics and a pixel electrode layer can be realized.

[Embodiment 6]

FIGS. 9A and 9B and FIGS. 10A and 10B illustrate examples of a semiconductor device in which an In—Sn—O-based oxide semiconductor layer including a source region or a drain region and a pixel electrode region is formed in an opening formed in an insulating layer over a thin film transistor.

Figure 9A:
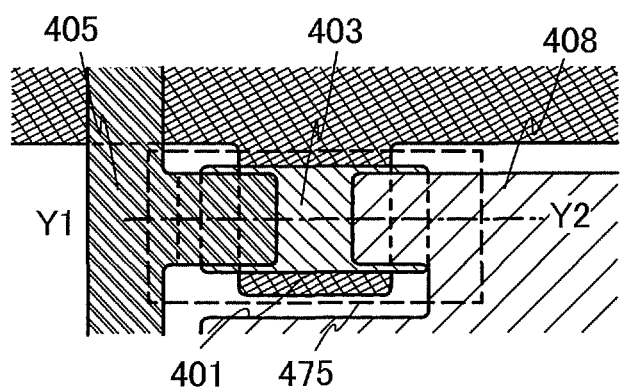
FIGS. 9A and 9B illustrate a semiconductor device.
Figure 9B:
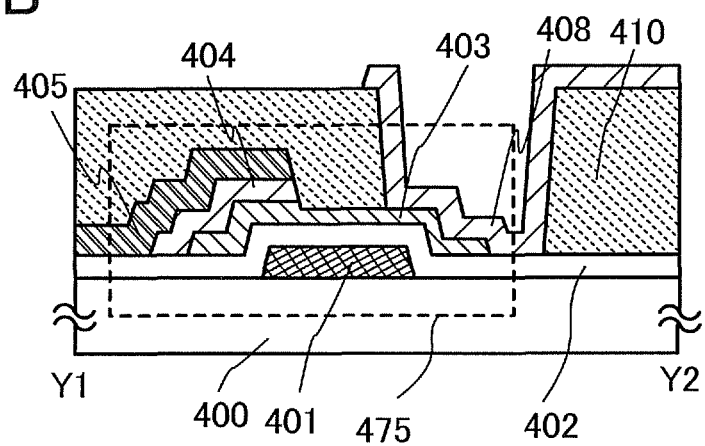

FIG. 9A is a top view of a thin film transistor 475 included in a semiconductor device, and FIG. 9B is a cross-sectional view taken along line Y1-Y2 of FIG. 9A. The thin film transistor 475 is an inverted staggered thin film transistor and includes, over a substrate 400 which is a substrate having an insulating surface, a gate electrode layer 401, a gate insulating layer 402, an In—Sn—O-based oxide semiconductor layer 403 including SiO$_X$, a source electrode layer or drain electrode layer 405, an In—Sn—O-based oxide semiconductor layers 404 functioning as a source region or a drain region, an insulating layer 410, and an In—Sn—O-based oxide semiconductor layer 408.

In FIGS. 9A and 9B, the In—Sn—O-based oxide semiconductor layer 408 which does not include SiO$_X$ and has both functions of the source region or the drain region and a pixel electrode layer is in contact with the In—Sn—O-based oxide semiconductor layer 403 including SiO$_X$ of the thin film transistor 475 at the opening formed in the insulating layer 410 and electrically connected thereto.

Figure 10A:
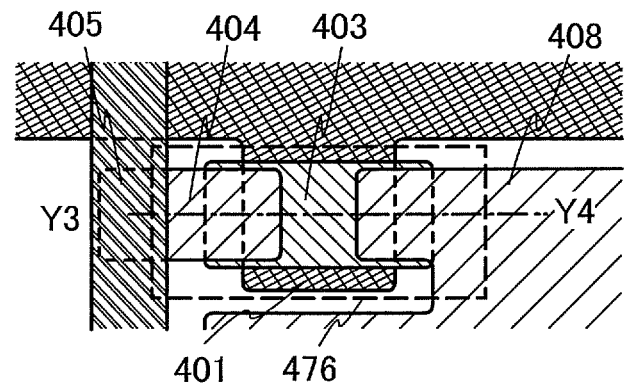
FIGS. 10A and 10B illustrate a semiconductor device.
Figure 10B:
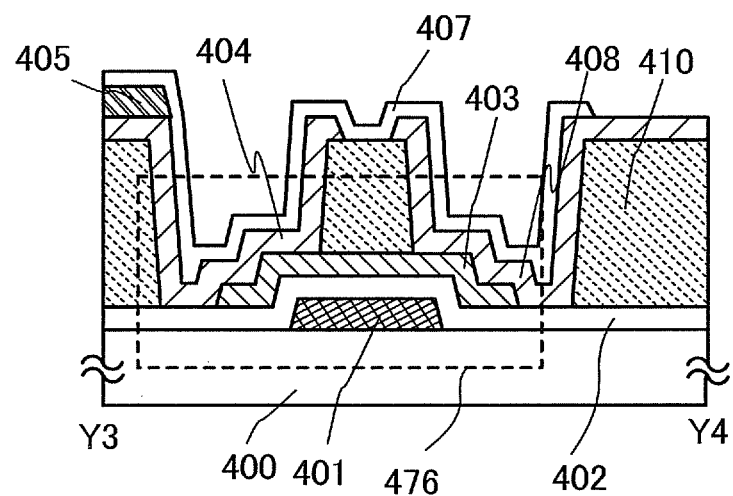

FIG. 10A is a top view of a thin film transistor 476 included in a semiconductor device, and FIG. 10B is a cross-sectional view taken along line Y3-Y4 of FIG. 10A. The thin film transistor 476 is an inverted staggered thin film transistor and includes, over a substrate 400 which is a substrate having an insulating surface, a gate electrode layer 401, a gate insulating layer 402, an In—Sn—O-based oxide semiconductor layer 403 including SiO$_X$, an insulating layer 410, a source electrode layer or drain electrode layer 405, an In—Sn—O-based oxide semiconductor layer 404 functioning as a source region or a drain region, an In—Sn—O-based oxide semiconductor layer 408.

In FIGS. 10A and 10B, the In—Sn—O-based oxide semiconductor layers 404 functioning as the source region or drain region and the In—Sn—O-based oxide semiconductor layer 408 which does not include SiO$_X$ and serves as the source region or drain region are in contact with the In—Sn—O-based oxide semiconductor layer 403 including SiO$_X$ of the thin film transistor 475 at an opening formed in the insulating layer 410, and electrically connected thereto. In addition, the source electrode layer or drain electrode layer 405 is formed over the In—Sn—O-based oxide semiconductor layer 404. The insulating film 407 is formed so as not to cover the pixel electrode region of the In—Sn—O-based oxide semiconductor layer 408 which does not include SiO$_X$.

In this manner, the source region, the drain region, and the In—Sn—O-based oxide semiconductor layer to be the pixel electrode region may be formed after the insulating layer functioning as a planarization insulating film is formed over the thin film transistor.

As the planarization insulating film, an organic material such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like.

Note that a siloxane-based resin is a resin formed from a siloxane-based material as a starting material and having the bond of Si—O—Si. The siloxane-based resin may include an organic group (for example, an alkyl group or an aryl group) or a fluoro group as a substituent. The organic group may include a fluoro group.

The method for the formation method of the planarization insulating film is not limited to a particular method and the following method can be used depending on the material of the planarization insulating film: a sputtering method, an SOG method, spin coating, dip coating, spray coating, a droplet discharge method (e.g., an inkjet method, screen printing, or offset printing), a doctor knife, a roll coater, a curtain coater, a knife coater, or the like.

In this embodiment, an example of application of the thin film transistor described in Embodiment 1 is described; however, this embodiment is not limited thereto and can be implemented in combination with any of the structures described other embodiments.

Accordingly, a semiconductor device provided with a thin film transistor having excellent characteristics and a pixel electrode layer can be realized.

[Embodiment 7]

In this embodiment, an example of a thin film transistor whose width of a gate electrode is different from that of the transistor of Embodiment 1 is described with reference to FIGS. 11A1, 11A2, 11B1, and 11B2, FIG. 12, FIG. 13, and FIG. 31.

Figure 12:
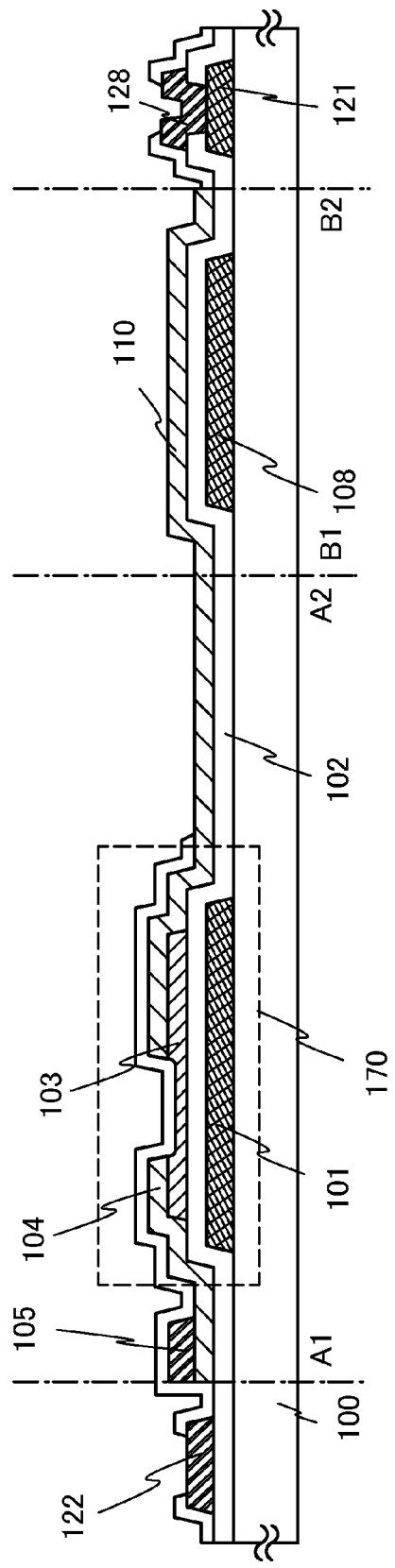
FIG. 12 illustrates a method of manufacturing a semiconductor device.
Figure 13:
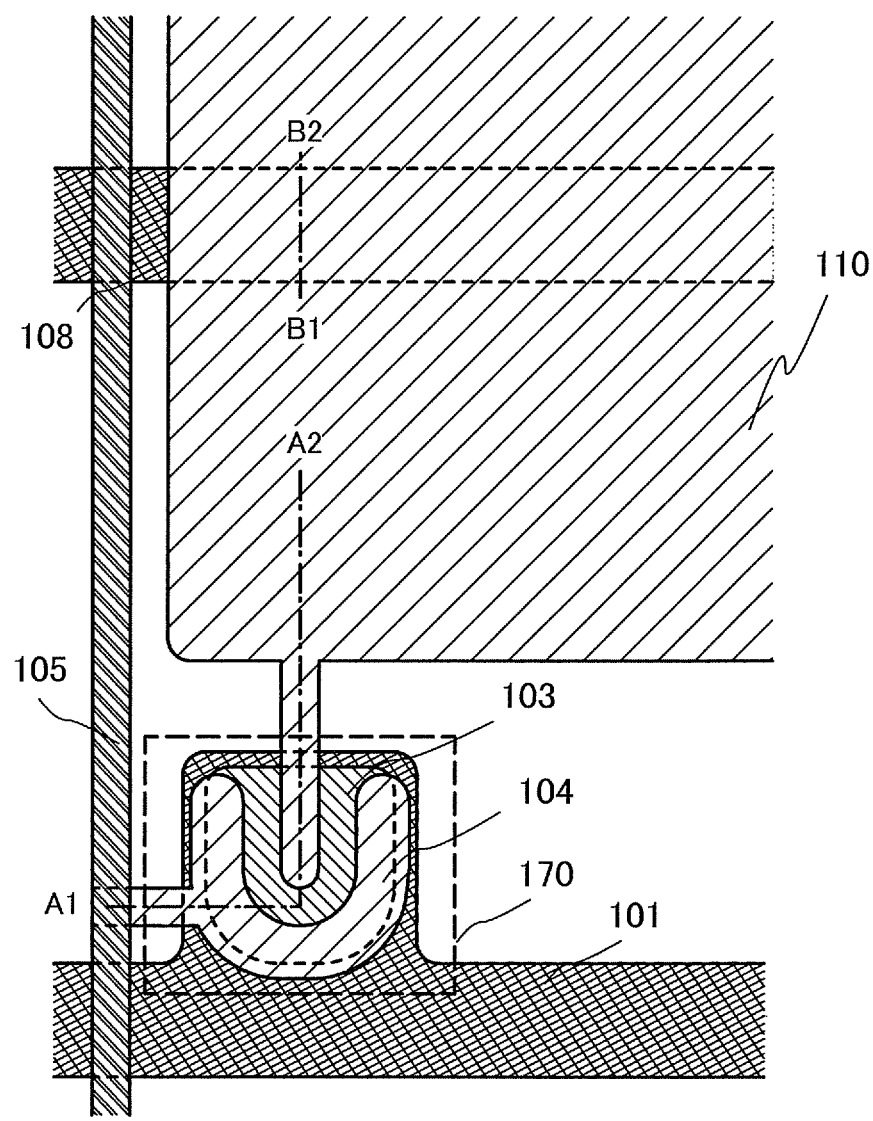
FIG. 13 illustrates a semiconductor device.

FIG. 13 is a plan view of a semiconductor device including a thin film transistor 170, and FIG. 12 is a cross-sectional view taken along lines A1-A2 and B1-B2 of FIG. 13. The thin film transistor 170 is an inverted staggered thin film transistor and includes, over a substrate 100 which is a substrate having an insulating surface, a gate electrode layer 101, a gate insulating layer 102, an In—Sn—O-based oxide semiconductor layer 103 including SiO$_X$, an In—Sn—O-based oxide semiconductor layer 104 functioning as a source region or a drain region, an In—Sn—O-based oxide semiconductor layer 110, and a source electrode layer or drain electrode layer 105. In addition, a protective insulating film 107 is provided to cover the thin film transistor 170 and be in contact with the In—Sn—O-based oxide semiconductor layer 103 including SiO$_X$.

An In—Sn—O-based oxide semiconductor layer including silicon oxide or silicon oxynitride is used for a semiconductor layer including a channel formation region. The conductivity of the In—Sn—O-based oxide semiconductor layer 103 including SiO$_X$ is preferably $1.6 \times 10^{-3}$ S/cm or less, or more preferably $1.3 \times 10^{-4}$ S/cm or less. Note that the In—Sn—O-based oxide semiconductor layer 103 including SiO$_X$ is formed by a sputtering method using an In—Sn—O-based oxide semiconductor target including SiO$_2$ at wt % or higher and 50 wt % or lower, or preferably at 10 wt % or higher and 30 wt % or lower.

The In—Sn—O-based oxide semiconductor layer 104 reduces contact resistance. The In—Sn—O-based oxide semiconductor layer 104 is formed as the source region or drain region between the source electrode layer or a drain electrode layer 105 formed from a metal material having low electric resistance and the In—Sn—O-based oxide semiconductor layer 103 including SiO$_X$. One of the source region and the drain region is formed with the In—Sn—O-based oxide semiconductor layer 110 which is the same layer as a pixel electrode region. Therefore, the In—Sn—O-based oxide semiconductor layer 110 has both functions of the source region or the drain region and a pixel electrode.

The In—Sn—O-based oxide semiconductor layer 104 and the In—Sn—O-based oxide semiconductor layer 110 are formed using an In—Sn—O-based oxide semiconductor layer which does not include $SiO_X$. The In—Sn—O-based oxide semiconductor layer 104 and the In—Sn—O-based oxide semiconductor layer 110 largely differ from the In—Sn—O-based oxide semiconductor layer 103 including $SiO_X$ in that they do not include Si. The In—Sn—O-based oxide semiconductor layer 104 and the In—Sn—O-based oxide semiconductor layer 110 can have lower resistance (higher conductivity) than the In—Sn—O-based oxide semiconductor layer 103 including $SiO_X$. An In—Sn—O-based oxide semiconductor to which nitrogen is added may be used for the source region, the drain region, and the pixel electrode region. For example, an In—Sn—O-based non-single-crystal film including nitrogen can be used.

The thin film transistor 170 functions as a switching element of a pixel portion in the semiconductor device of FIG. 12. An example of manufacturing the semiconductor device is described below.

A conductive layer is formed over the substrate 100 having an insulating surface. As the substrate 100 having an insulating surface, a glass substrate formed of barium borosilicate glass, alumino-borosilicate glass, or the like can be used.

Next, a photolithography step is performed to form a resist mask. Then, unnecessary portions of the conductive layer are removed, so that wirings and an electrode (a gate wiring including the gate electrode layer 101, a capacitor wiring 108, and a first terminal 121) are formed.

Each of the gate wiring including the gate electrode layer 101, the capacitor wiring 108, and the first terminal 121 of a terminal portion can be formed with a single layer or a stacked layer using a conductive material such as metal material selected from titanium (Ti), tantalum (Ta), tungsten (W), molybdenum (Mo), chromium (Cr), neodymium (Nd), and scandium (Sc); or an alloy material including any of these materials as its main component. In addition, aluminum (Al), copper (Cu), or an alloy material including any of these materials as its main component may be used.

For example, as a two-layer structure of the gate electrode layer 101, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, and a two-layer structure in which a titanium nitride layer and a molybdenum layer are stacked. In addition, a stack-layer in which a copper oxide layer including Ca which is to be a barrier layer is formed over a copper layer including Ca, a stack-layer in which a copper oxide layer including Mg which is to be a barrier layer is formed over a copper layer including Mg, and the like are also preferable. Further, as a three-layer structure, it is preferable to stack a tungsten layer or a tungsten nitride layer, an alloy of aluminum and silicon or an alloy of aluminum and titanium, and a titanium nitride layer or a titanium layer.

Next, the gate insulating layer 102 is formed over the entire surface of the gate electrode layer 101. The gate insulating layer 102 is formed to have a thickness of 50 nm to 400 nm inclusive by a sputtering method, a PCVD method, or the like.

For example, for the gate insulating layer 102, a silicon oxide film with a thickness of 100 nm is formed by a sputtering method. Needless to say, the gate insulating layer 102 is not limited to such a silicon oxide film, and other insulating films such as a silicon oxynitride film, a silicon nitride film, an aluminum oxide film, an aluminum nitride film, an aluminum oxynitride film, or a tantalum oxide film may be used to form a single-layer structure or a stacked-layer structure. In the case of employing a stacked-layer structure, for example, a silicon nitride film may be formed by a PCVD method and then a silicon oxide film may be formed thereover by a sputtering method. When a silicon oxynitride film, a silicon nitride film, or the like is used as the gate insulating layer 102, an impurity from the glass substrate, sodium for example, can be blocked from diffusing into and entering an oxide semiconductor to be formed thereover later.

Next, an In—Sn—O-based oxide semiconductor film including $SiO_X$ is formed over the gate insulating layer 102. The In—Sn—O-based oxide semiconductor film including $SiO_X$ is formed by a sputtering method using an In—Sn—O-based oxide semiconductor target including $SiO_2$ at 5 wt % or higher and 50 wt % or lower, or preferably at 10 wt % or higher and 30 wt % or lower. By including $SiO_X$ in an In—Sn—O-based oxide semiconductor, the In—Sn—O-based oxide semiconductor including $SiO_X$ easily becomes amorphous in its formation. The In—Sn—O-based oxide semiconductor film including $SiO_X$ is etched using a resist mask formed through a photolithography step to form an In—Sn—O-based oxide semiconductor layer including $SiO_X$. The conductivity of the In—Sn—O-based oxide semiconductor layer 103 including $SiO_X$ is preferably less than $1.6\times10^{-3}$ S/cm, or more preferably less than $1.3\times10^{-4}$ S/cm.

Then, an In—Sn—O-based oxide semiconductor film which does not include $SiO_X$ is formed using an In—Sn—O-based oxide semiconductor target which does not include $SiO_X$. The In—Sn—O-based oxide semiconductor film which does not include $SiO_X$ is etched using a resist mask formed through a photolithography step to form an In—Sn—O-based oxide semiconductor layer which does not include $SiO_X$.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Figure 36A:
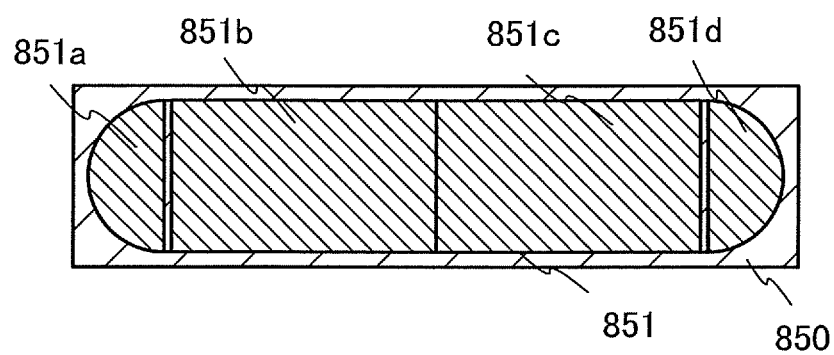
FIGS. 36A and 36B each illustrate a target which can be used for manufacturing a semiconductor device.
Figure 36B:
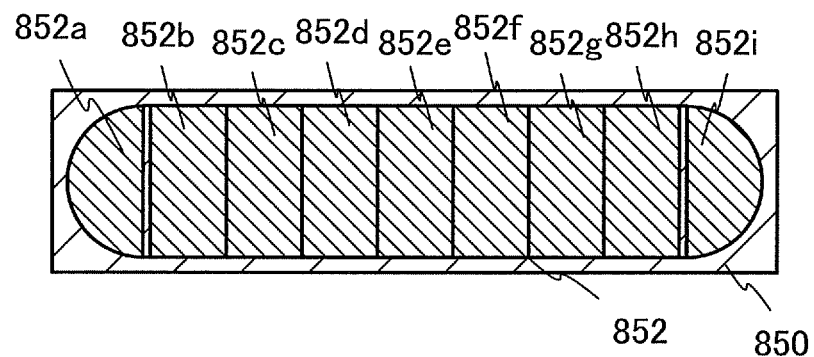

An In—Sn—O-based oxide semiconductor layer including $SiO_2$ and an In—Sn—O-based oxide semiconductor layer can be formed by a sputtering method using an In—Sn—O-based oxide semiconductor target including $SiO_2$ and an In—Sn—O-based oxide semiconductor target. The target is formed by attaching a target material to a bucking plate (a board for attaching a target thereto). As for the attachment of the target to the bucking plate, the target may be divided and attached to one bucking plate. FIGS. 36A and 36B illustrate examples in which the target is divided and attached (bonded) to one bucking plate.

FIG. 36A illustrates an example in which a target 851 is divided into four pieces of targets 851a, 851b, 851c, and 851d and they are attached to a bucking plate 850. FIG. 36B illustrates an example in which a target is divided to a larger number of targets, that is, a target 852 is divided into nine pieces of targets 852a, 852b, 852c, 852d, 852e, 852f, 852g, 852h, and 852i. Note that the number of pieces of targets divided is not limited to the number in the case of FIG. 36A or FIG. 36B. When the target is divided, warpage of the target can be relaxed in the attachment of the target to the bucking plate. In particular, when the thin film is formed over a large substrate, such divided targets can be suitably used for a target which is upsized in accordance with the size of the large substrate. Needless to say, one target may be attached to one bucking plate.

As the etching, either wet etching or dry etching can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid, an ammonia peroxide mixture (hydrogen peroxide:ammonia:water=5:2:2), or the like can be used. Alternatively, ITO07N (manufactured by Kanto Chemical Co., Inc.) may be used.

Furthermore, the etchant after the wet etching is removed together with the etched material by cleaning. Waste liquid of the etchant including the removed material may be purified to recycle the materials included in the waste liquid. A material such as indium included in the oxide semiconductor layer are collected from the waste liquid after the etching and recycled, so that resources can be effectively used and cost can be reduced.

The etching conditions (such as an etchant, etching time, and temperature) are appropriately adjusted depending on the material so that the material can be etched into a desired shape.

Next, a photolithography step is performed to form a resist mask, and unnecessary portions (part of the gate insulating layer) are removed by etching, so that a contact hole which is formed from the same material as the gate electrode layer and reaches the wiring or the electrode layer is formed. This contact hole is provided for direct contact with a conductive film formed later. For example, in a driver circuit portion, a contact hole is formed in the case where a thin film transistor whose gate electrode layer is direct contact with a source electrode layer or drain electrode layer or a terminal that is electrically connected to a gate wiring of a terminal portion is formed.

Next, the conductive film formed from a metal material is formed by a sputtering method or a vacuum evaporation method over the In—Sn—O-based oxide semiconductor layer including $SiO_X$ and the In—Sn—O-based oxide semiconductor layer which does not include $SiO_X$.

As examples of a material of the conductive film, an element selected from Al, Cr, Ta, Ti, Mo, W, Nd, and Sc, an alloy including any of these elements as its component, an alloy including any of the elements in combination, and the like can be given.

For example, a single-layer structure of a titanium film, a two-layer structure in which a titanium film is stacked over an aluminum film, or the like may be employed for the conductive film. Alternatively, the conductive film may have a three-layer structure in which a Ti film, an aluminum film including Nd (Al—Nd), and a Ti film are stacked in this order. The conductive film may have a single-layer structure of an aluminum film including silicon.

Then, a photolithography step is performed to form a resist mask and unnecessary portions are removed by etching to form a conductive layer 128 connected to the source electrode layer or drain electrode layer 105, a second terminal 122, and the first terminal 121. Note that the second terminal 122 is electrically connected to a source wiring (a source wiring including the source electrode layer or drain electrode layer 105).

A photolithography step is performed to form a resist mask over the In—Sn—O-based oxide semiconductor layer including $SiO_X$. The In—Sn—O-based oxide semiconductor layer including $SiO_X$ and the In—Sn—O-based oxide semiconductor layer are etched using the mask to form the In—Sn—O-based oxide semiconductor layer 103 including $SiO_X$, the In—Sn—O-based oxide semiconductor layer 104, and the In—Sn—O-based oxide semiconductor layer 110. Note that only part of the In—Sn—O-based oxide semiconductor layer 103 including $SiO_X$ is etched so that the In—Sn—O-based oxide semiconductor layer 103 including $SiO_X$ has a groove (a recessed portion). The In—Sn—O-based oxide semiconductor layer 104 functions as the source region or drain region. The In—Sn—O-based oxide semiconductor layer 110 functions as the source region or drain region and the pixel electrode.

Through the above steps, a semiconductor device whose pixel portion includes the thin film transistor 170 in which the In—Sn—O-based oxide semiconductor layer 103 including $SiO_X$ serves as the channel formation region, and the In—Sn—O-based oxide semiconductor layer serves as the pixel electrode can be manufactured. Note that a top view at this stage corresponds to FIG. 13.

Further, by use of a resist mask having regions with plural thicknesses (typically, two different thicknesses) which is formed using a multi-tone mask, the number of resist masks can be reduced, resulting in simplified process and lower costs.

Next, the protective insulating layer 107 is formed to cover the thin film transistor 170. For the protective insulating layer 107, a silicon nitride film, a silicon oxide film, a silicon oxynitride film, an aluminum oxide film, a tantalum oxide film, or the like which is obtained by a sputtering method or the like can be used.

Next, a photolithography step is performed to form a resist mask and the protective insulating layer 107 is etched, so that a pixel electrode region of the In—Sn—O-based oxide semiconductor layer 110 is exposed. In addition, a contact hole reaching the second terminal 122 and a contact hole reaching the conductive layer 128 are also formed in this etching.

The conductive layer 128 directly connected to the first terminal 121 serves as a connection terminal electrode functioning as an input terminal of the gate wiring. The second terminal 122 is a connection terminal electrode functioning as an input terminal of the source wiring.

FIGS. 11A1 and 11A2 are respectively a cross-sectional view and a top view of a gate wiring terminal portion at this stage. FIG. 11A1 corresponds to a cross-sectional view taken along line E1-E2 of FIG. 11A2. In FIG. 11A1, a conductive layer 153 which is exposed by removing the protective insulating film 154 is a connection terminal electrode functioning as an input terminal. Furthermore, in the terminal portion of FIG. 11A1, a first terminal 151 formed from the same material as the gate wiring and the conductive layer 153 formed from the same material as the source wiring are connected to each other and brought into conduction. Note that the portion illustrated in FIG. 12 where the conductive layer 128 is in contact with the first terminal 121 corresponds to a portion illustrated in FIG. 11A1 where the conductive layer 153 is in contact with the first terminal 151.

FIGS. 11B1 and 11B2 are respectively a cross-sectional view and a top view of a source wiring terminal portion which is different from that illustrated in FIG. 12C. Moreover, FIG. 11B1 corresponds to a cross-sectional view taken along line F1-F2 of FIG. 11B2. In FIG. 11B1, the second terminal 150 which is exposed by removing the protective insulating film 154 is a connection terminal electrode functioning as an input terminal. In the terminal portion of FIG. 11B1, an electrode layer 156 formed of the same material as the gate wiring is disposed below the second terminal 150 electrically connected to the source wiring, with the gate insulating layer 152 interposed between the second terminal 150 and the electrode layer 156. The electrode layer 156 is not electrically connected to the second terminal 150, and a capacitor to prevent noise or static electricity can be formed when the potential of the electrode layer 156 is set to a potential different from that of the second terminal 150, such as floating, GND, or 0 V.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of each of the terminals, and the number of the terminals may be determined by a practitioner as appropriate.

In this manner, the pixel portion including the thin film transistor 170 that is a bottom-gate n-channel thin film transistor, the pixel electrode, and a storage capacitor and the terminal portion can be completed. In addition, a driver circuit can be formed over the same substrate. These are arranged in matrix in respective pixels so that a pixel portion is formed, which can be used as one of substrates for manufacturing an active matrix display device. In this specification, such a substrate is referred to as an active matrix substrate for convenience.

When an active matrix liquid crystal display device is manufactured, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. This fourth terminal is provided so that the common electrode is fixed to a predetermined potential such as GND or 0 V.

Figure 31:
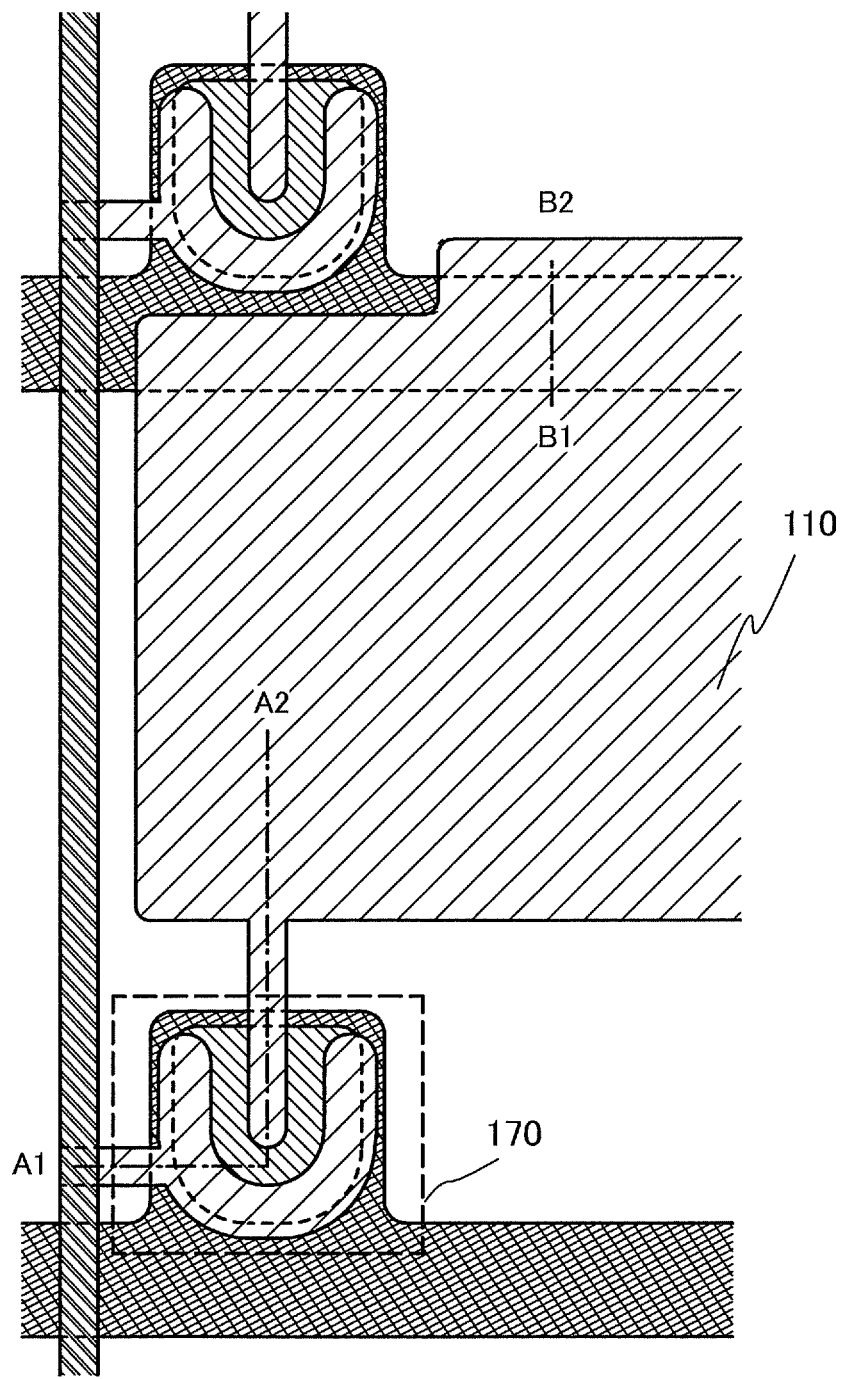
FIG. 31 illustrates a semiconductor device.
Figure 32:
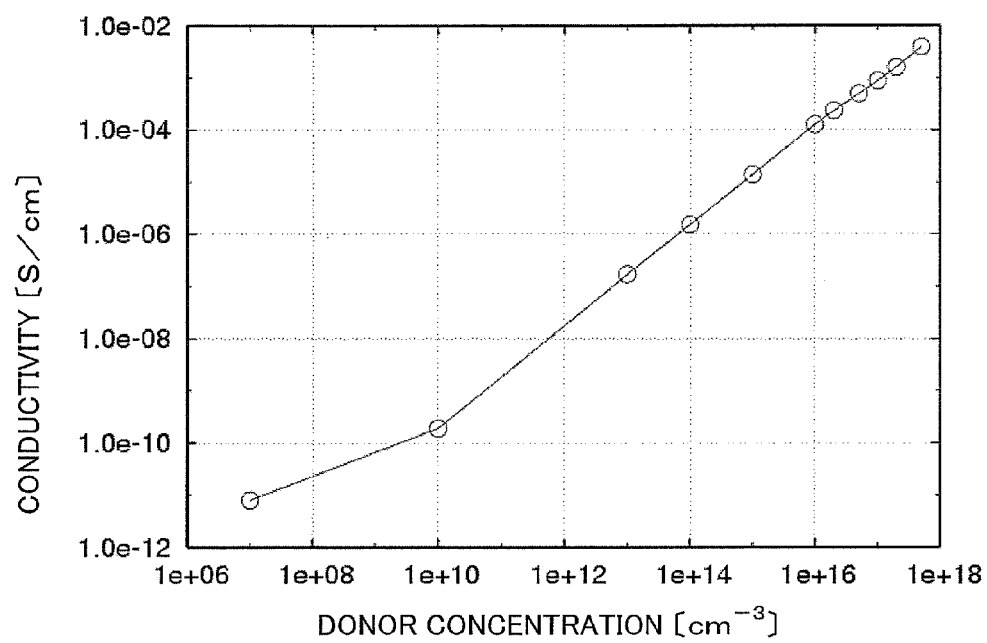
FIG. 32 is a graph showing results of computation.
Figure 33A:
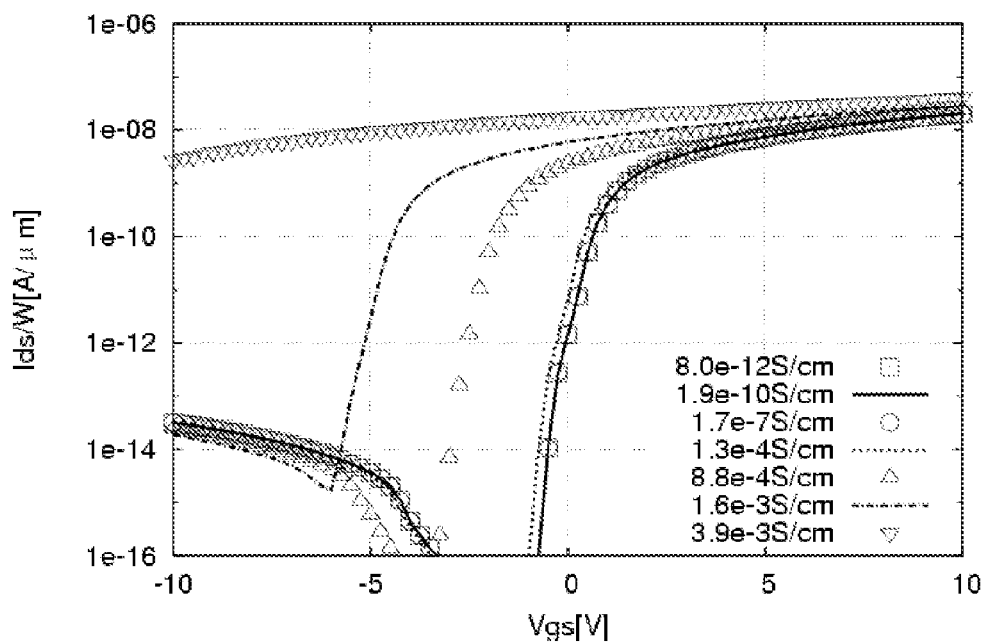
FIGS. 33A and 33B are graphs showing results of computation.
Figure 33B:
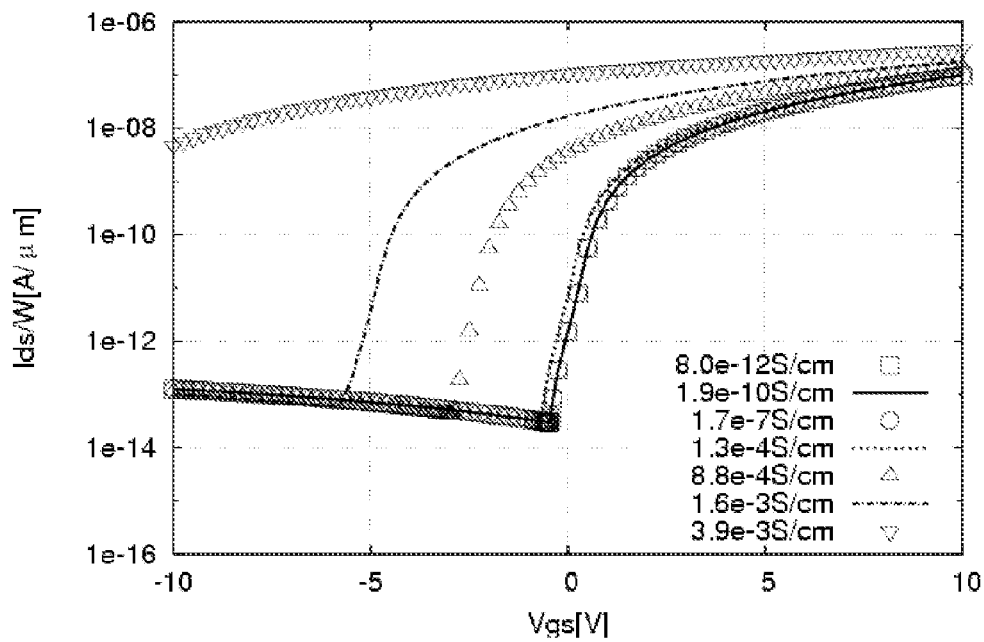
Figure 34:
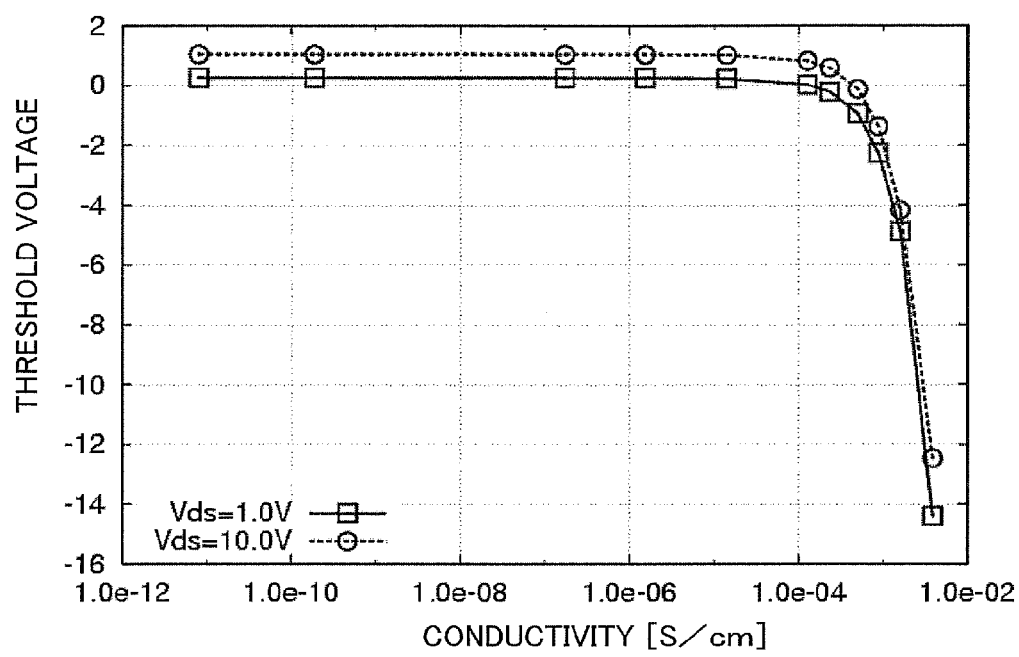
FIG. 34 is a graph showing results of computation.
Figure 35:
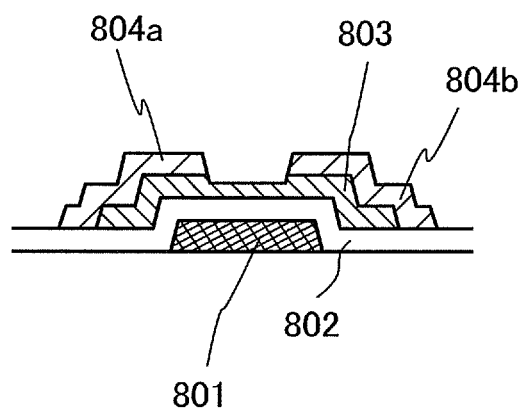
FIG. 35 illustrates a model of the computation.

The embodiment of the present invention is not limited to the pixel structure of FIG. 13. An example of the top view having a pixel structure different from that of FIG. 13 is illustrated in FIG. 31. FIG. 31 illustrates an example in which a capacitor wiring is not provided and a storage capacitor is formed with a pixel electrode region and a gate wiring of an adjacent pixel which overlap with each other with a protective insulating film and a gate insulating layer interposed therebetween. In this case, the capacitor wiring and a third terminal connected to the capacitor wiring can be omitted. Note that in FIG. 31, portions similar to those in FIG. 13 are denoted by the same reference numerals.

In an active matrix liquid crystal display device, display patterns are formed on a screen by driving pixel electrodes arranged in a matrix. In more detail, when voltage is applied between a selected pixel electrode and a counter electrode that corresponds to the selected pixel electrode, a liquid crystal layer provided between the pixel electrode and the counter electrode is optically modulated, and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which a vertical synchronizing frequency is 1.5 times or more, preferably, 2 times or more as high as a usual vertical synchronizing frequency, whereby the moving-image characteristics are improved.

Further alternatively, in order to improve the moving-image characteristics of a liquid crystal display device, a driving method may be employed in which a plurality of LED (light-emitting diode) light sources or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The use of the oxide semiconductor for the thin film transistor leads to reduction in manufacturing cost.

This embodiment can be implemented in appropriate combination with any of the structures described in the other embodiments.

[Embodiment 8]

An example will be described below, in which at least a part of a driver circuit and a thin film transistor arranged in a pixel portion are formed over the same substrate in a display device which is one example of a semiconductor device.

The thin film transistor arranged in the pixel portion includes an In—Sn—O-based oxide semiconductor layer including $SiO_x$, as a semiconductor layer including a channel formation region; and an In—Sn—O-based oxide semiconductor layer which does not include $SiO_x$, as a source region and a drain region. The thin film transistor arranged in the pixel portion is formed in accordance with Embodiments 1 to 7. Further, the thin film transistor described in Embodiments 1 to 7 is an n-channel TFT, and thus a part of a driver circuit that can include an n-channel TFT among driver circuits is formed over the same substrate as the thin film transistor of the pixel portion.

Figure 14A:
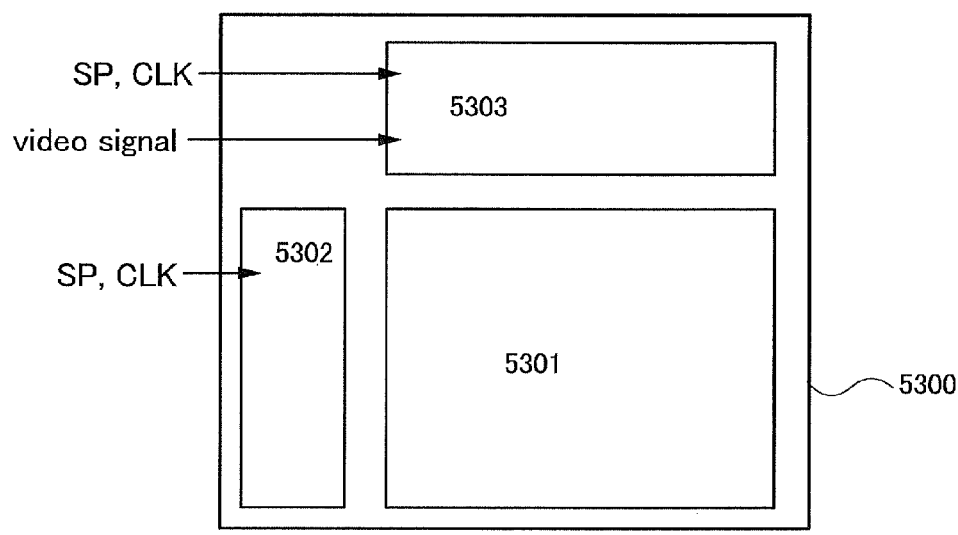
FIGS. 14A and 14B are block diagrams each illustrating a semiconductor device.

FIG. 14A is an example of a block diagram of an active matrix liquid crystal display device which is an example of a semiconductor device. The display device illustrated in FIG. 14A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

In addition, the thin film transistor described in Embodiments 1 to 7 is an n-channel TFT, and a signal line driver circuit including the n-channel TFT is described with reference to FIG. 15.

Figure 15:
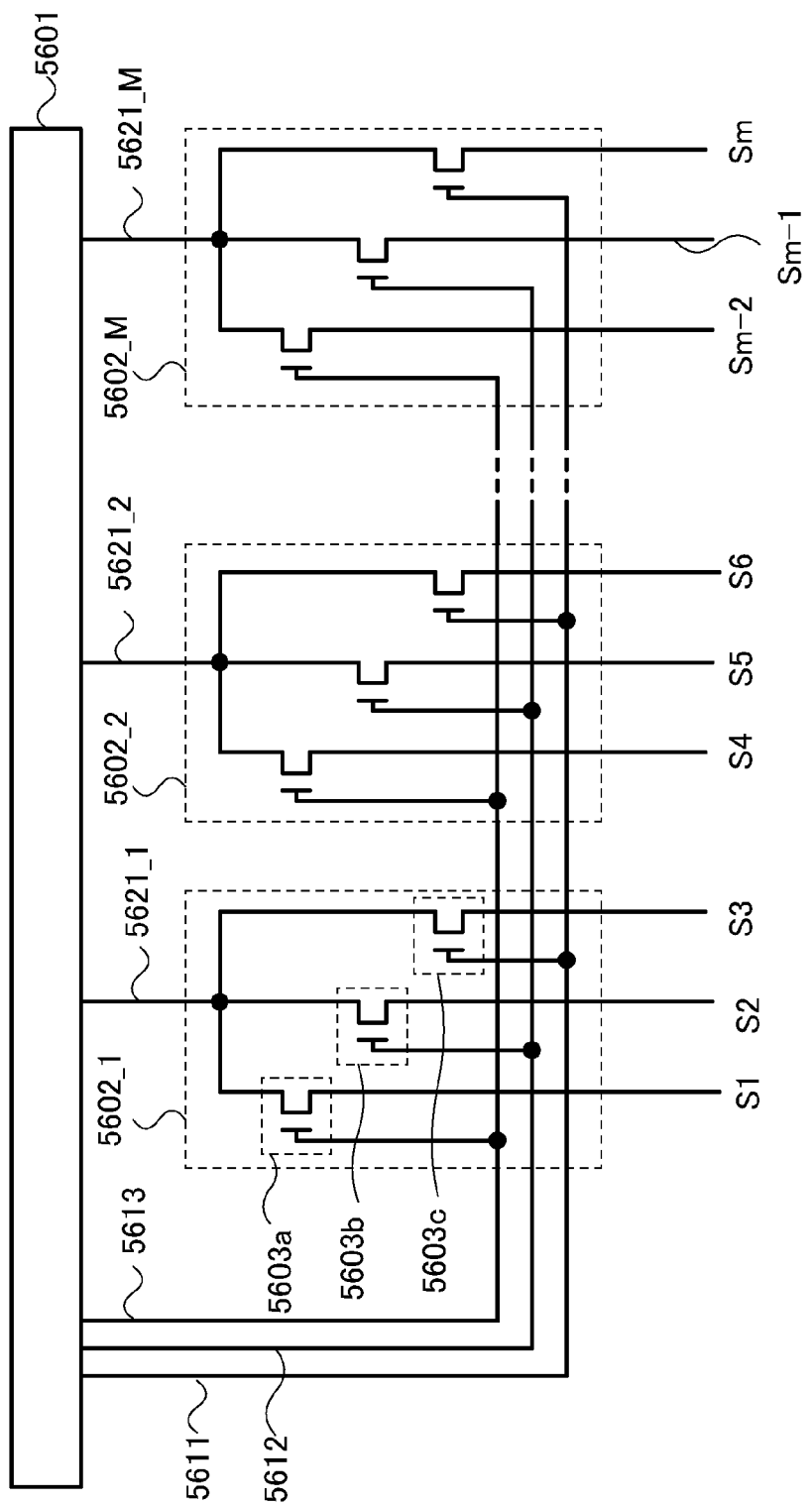
FIG. 15 illustrates a configuration of a signal line driver circuit.

The signal line driver circuit illustrated in FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c, respectively, which are included in the switch group 5602_J.

A signal is input to each of the first wiring 5611, the second wiring 5612, and the third wiring 5613.

Note that the driver IC 5601 is preferably formed over a single crystal substrate. Further, the switch groups 5602_1 to 5602_M are preferably formed over the same substrate as the pixel portion is. Therefore, the driver IC 5601 and the switch groups 5602_1 to 5602_M are preferably connected through an FPC or the like.

Figure 16:
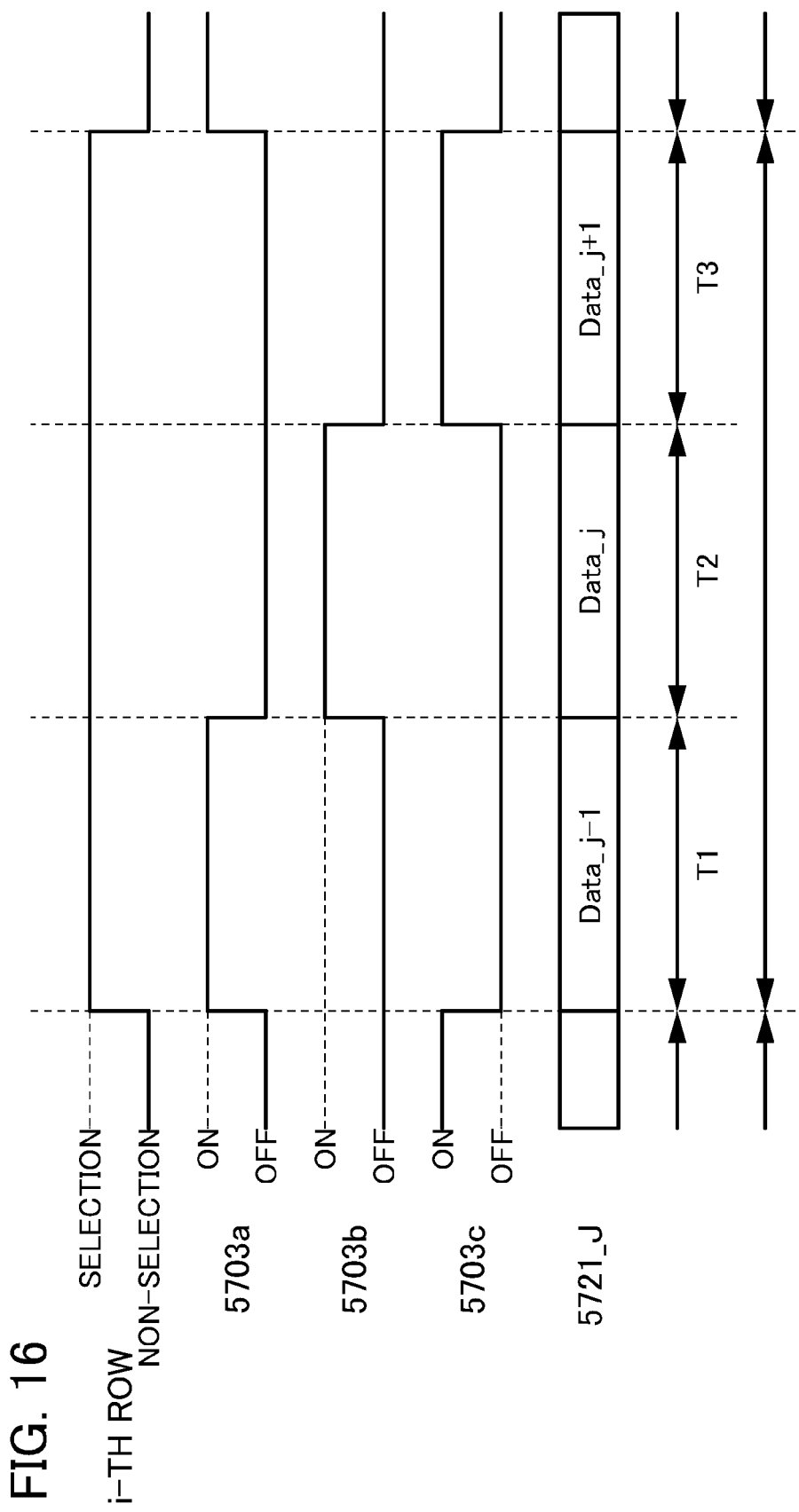
FIG. 16 is a timing chart illustrating operation of a signal line driver circuit.

Next, an operation of the signal line driver circuit illustrated in FIG. 15 is described with reference to a timing chart in FIG. 16. The timing chart in FIG. 16 illustrates the case where the scan line Gi of the i-th row is selected. A selection period of the scan line Gi of the i-th row is divided into a first sub-selection period T1, a second sub-selection period T2, and a third sub-selection period T3. In addition, even when a scan line of another row is selected, the signal line driver circuit in FIG. 15 operates in a manner similar to FIG. 16.

Note that the timing chart in FIG. 16 shows the case where the wiring 5621_J of the J-th column is connected to the signal line Sj−1, the signal line Sj, and the signal line Sj+1 via the first thin film transistor 5603a, the second thin film transistor 5603b, and the third thin film transistor 5603c, respectively.

Note that the timing chart in FIG. 16 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2 and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, the video signals input to the wiring 5621_J in the first sub-selection period T1, the second sub-selection period T2, and the third sub-selection period T3 are denoted by Data_j−1, Data_j, and Data_j+1.

As shown in FIG. 16, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 15, by dividing one gate selection period into three, video signals can be input to three signal lines from one wiring 5621 in one gate selection period. Therefore, in the signal line driver circuit in FIG. 15, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 15 can be improved.

Note that there are no particular limitation on the arrangement, the number, a driving method, and the like of the thin film transistors, as long as one gate selection period is divided into a plurality of sub-selection periods and video signals are input to a plurality of signal lines from one wiring in the respective sub-selection periods as shown in FIG. 15.

For example, when video signals are input to three or more signal lines from one wiring in three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 17:
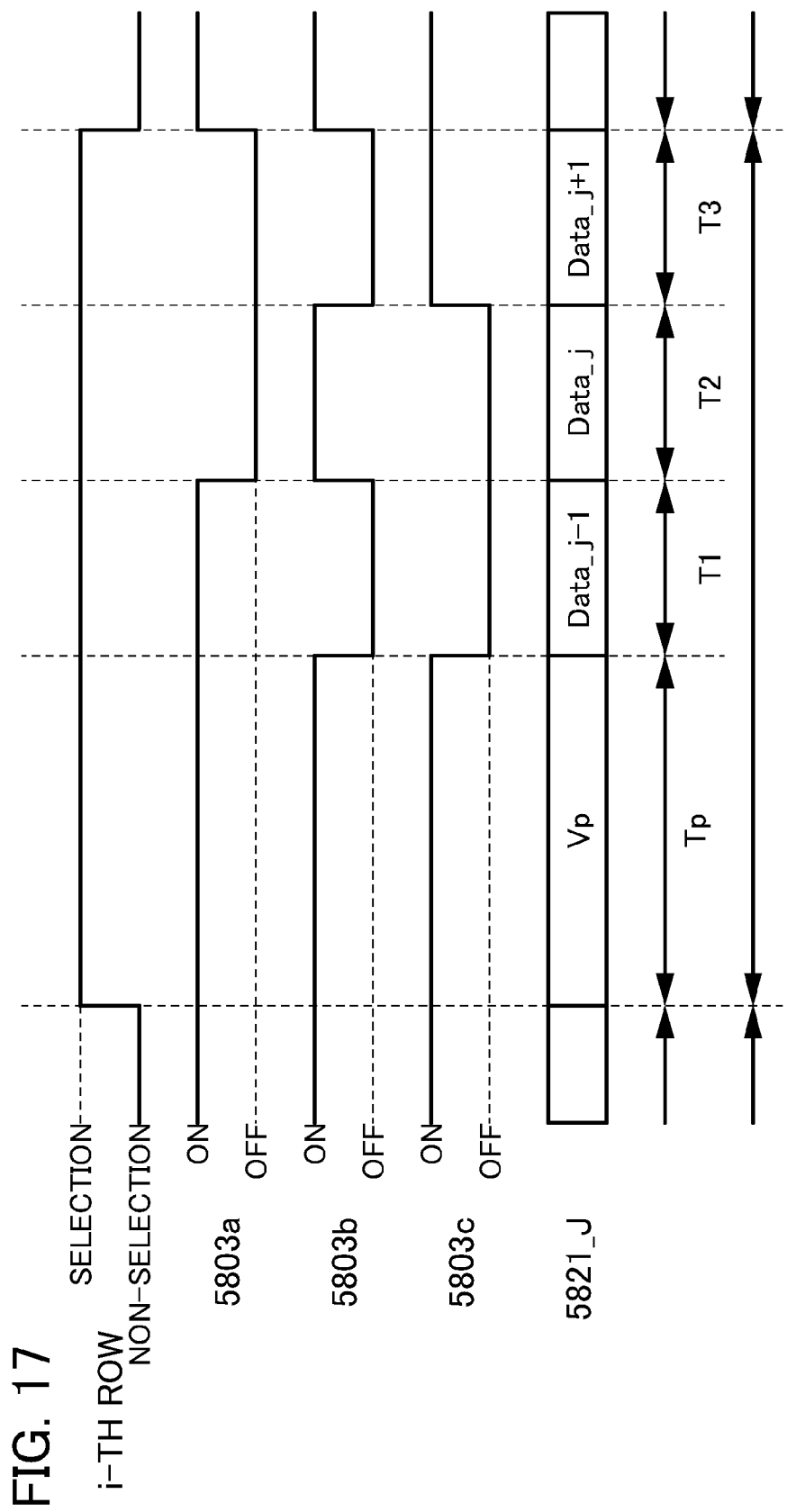
FIG. 17 is a timing chart illustrating operation of a signal line driver circuit.

As another example, one selection period may be divided into a precharge period Tp, the first sub-selection period T1, the second sub-selection period T2, and the third sub-selection period T3 as shown in a timing chart of FIG. 17. The timing chart of FIG. 17 shows the timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As shown in FIG. 17, the first thin film transistor 5603a, the second thin film transistor 5603b, and the third thin film transistor 5603c are tuned on in the precharge period Tp. At this time, precharge voltage Vp input to the wiring 5621_J is input to the signal line Sj−1, the signal line Sj, and the signal line Sj+1 via the first thin film transistor 5603a, the second thin film transistor 5603b, and the third thin film transistor 5603c, respectively. In the first sub-selection period T1, the first thin film transistor 5603a is turned on, and the second thin film transistor 5603*b* and the third thin film transistor 5603*c* are turned off. At this time, Data_j−1 input to the wiring 5621_J is input to the signal line Sj−1 via the first thin film transistor 5603*a*. In the second sub-selection period T2, the second thin film transistor 5603*b* is turned on, and the first thin film transistor 5603*a* and the third thin film transistor 5603*c* are turned off. At this time, Data_j input to the wiring 5621_J is input to the signal line Sj via the second thin film transistor 5603*b*. In the third sub-selection period T3, the third thin film transistor 5603*c* is turned on, and the first thin film transistor 5603*a* and the second thin film transistor 5603*b* are turned off. At this time, Data_j+1 input to the wiring 5621_J is input to the signal line Sj+1 via the third thin film transistor 5603*c*.

As described above, in the signal line driver circuit of FIG. 15 to which the timing chart of FIG. 17 is applied, the video signal can be written to the pixel at high speed because the signal line can be precharged by providing a precharge selection period before a sub-selection period. Note that portions of FIG. 17 which are similar to those of FIG. 16 are denoted by common reference numerals and detailed description of like portions and portions having similar functions is omitted.

Further, a structure of a scan line driver circuit is described. The scan line driver circuit includes a shift register and a buffer. Additionally, the scan line driver circuit may include a level shifter. In the scan line driver circuit, when a clock signal (CLK) and a start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One mode of a shift register used for a part of the scan line driver circuit will be described with reference to FIG. 18 and FIG. 19.

Figure 18:
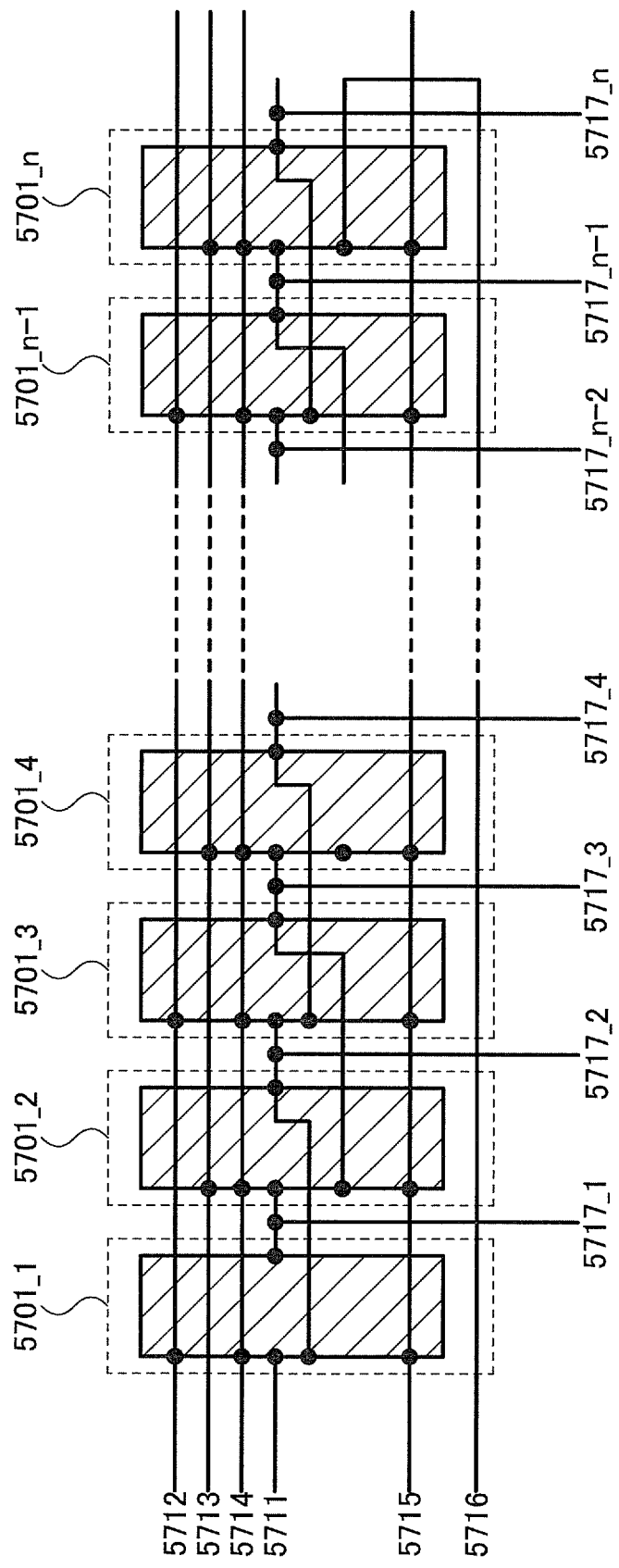
FIG. 18 illustrates a configuration of a shift register.

FIG. 18 illustrates a circuit structure of the shift register. The shift register illustrated in FIG. 18 includes a plurality of flip-flops: flip-flops 5701_1 to 5701_n. The shift register is operated with input of a first clock signal, a second clock signal, a start pulse signal, and a reset signal.

The connection relationship of the shift register of FIG. 18 will be described. In the i-th stage flip-flop 5701_i (one of the flip-flops 5701_1 to 5701_n) in the shift register of FIG. 18, a first wiring 5501 shown in FIG. 19 is connected to a seventh wiring 5717_i−1, a second wiring 5502 shown in FIG. 19 is connected to a seventh wiring 5717_i+1, a third wiring 5503 shown in FIG. 19 is connected to a seventh wiring 5717_i, and a sixth wiring 5506 shown in FIG. 19 is connected to a fifth wiring 5715.

Figure 19:
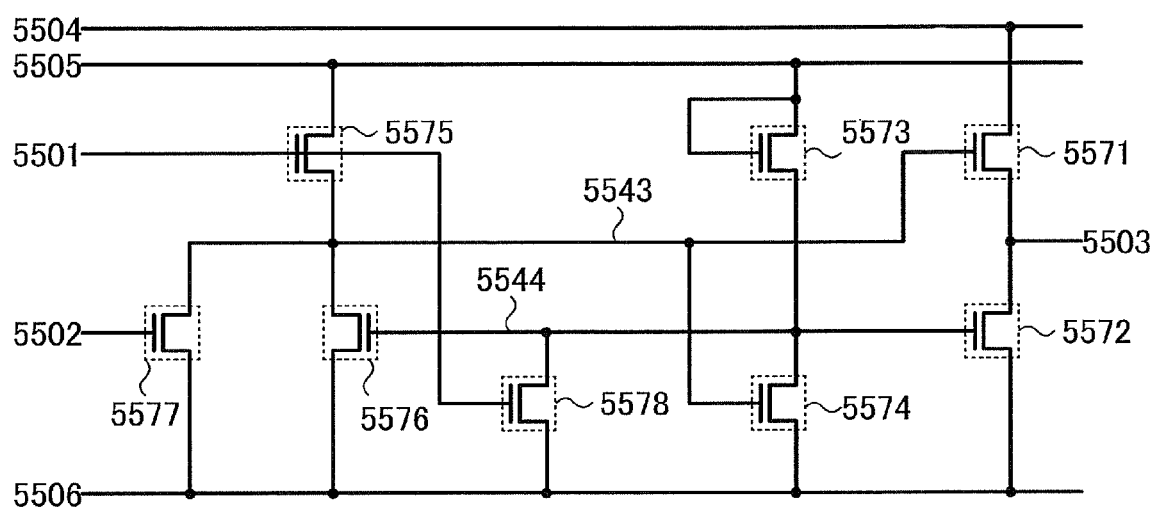
FIG. 19 illustrates a connection structure of a flip-flop illustrated in FIG. 18.

Further, a fourth wiring 5504 shown in FIG. 19 is connected to a second wiring 5712 in flip-flops of odd-numbered stages, and is connected to a third wiring 5713 in flip-flops of even-numbered stages. A fifth wiring 5505 shown in FIG. 19 is connected to a fourth wiring 5714.

Note that the first wiring 5501 of the first stage flip-flop 5701_1 which is shown in FIG. 19 is connected to a first wiring 5711. Moreover, the second wiring 5502 of the n-th stage flip-flop 5701_n which is shown in FIG. 19 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power source line and a second power source line, respectively.

Next, FIG. 19 illustrates details of the flip-flop shown in FIG. 18. A flip-flop shown in FIG. 19 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connection structures of the flip-flops shown in FIG. 18 will be described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, and a second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. The point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power source line and a second power source line, respectively.

In addition, the signal line driver circuit and the scan line driver circuit can be formed using only the n-channel TFTs described in Embodiment 1. The n-channel TFT described in Embodiment 1 has a high mobility of the transistor, and thus a driving frequency of a driver circuit can be increased. Further, parasitic capacitance is reduced by the source or drain region; thus, the n-channel TFT described in Embodiment 1 has high frequency characteristics (referred to as f characteristics). For example, a scan line driver circuit using the n-channel TFT described in Embodiment 1 can operate at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, an increase in frame frequency can be realized. Furthermore, the use of the plurality of scan line driver circuits for output of signals to the same scan line is advantageous in increasing the size of a display device.

Figure 14B:
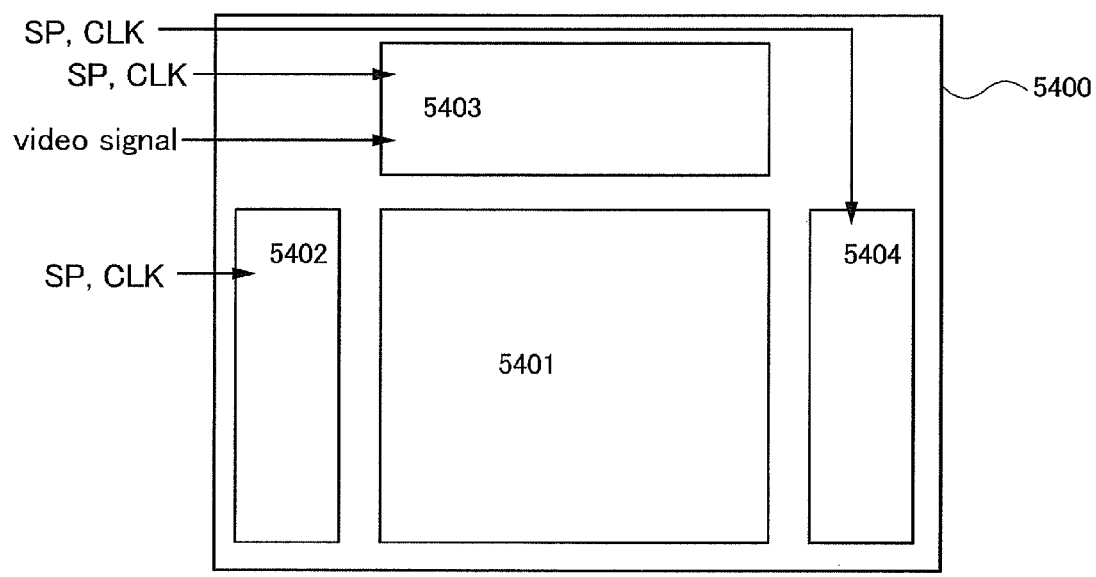

Further, when an active matrix light-emitting display device which is an example of a semiconductor device is manufactured, a plurality of thin film transistors are arranged in at least one pixel, and thus a plurality of scan line driver circuits are preferably arranged. FIG. 14B illustrates an example of a block diagram of an active matrix light-emitting display device.

The light-emitting display device illustrated in FIG. 14B includes, over a substrate 5400, a pixel portion 5401 including a plurality of pixels each provided with a display element, a first scan line driver circuit 5402 and a second scan line driver circuit 5404 for selecting a pixel, and a signal line driver circuit 5403 for controlling a video signal input to the selected pixel.

When the video signal input to a pixel of the light-emitting display device illustrated in FIG. 14B is a digital signal, a pixel emits light or does not emit light by switching a transistor on/off. Thus, grayscale can be displayed using an area grayscale method or a time grayscale method. An area grayscale method refers to a driving method in which one pixel is divided into a plurality of sub-pixels and each sub-pixel is driven independently based on a video signal so that grayscale is displayed. Further, a time grayscale method refers to a driving method in which a period during which a pixel emits light is controlled so that grayscale is displayed.

Since the response time of a light-emitting element is higher than that of a liquid crystal element or the like, the light-emitting element is more suitable for a time grayscale method than the liquid crystal element. Specifically, in the case of displaying with a time grayscale method, one frame period is divided into a plurality of sub-frame periods. Then, in accordance with video signals, the light-emitting element in the pixel is brought into a light-emitting state or a non-light-emitting state in each sub-frame period. By dividing one frame period into a plurality of sub-frame periods, the total length of time of a period, in which a pixel actually emits light in one frame period, can be controlled by video signals so that grayscale can be displayed.

Note that in the example of the light-emitting display device illustrated in FIG. 14B, when two switching TFTs are arranged in one pixel, the first scan line driver circuit 5402 generates a signal which is input to a first scan line serving as a gate wiring of one of the two switching TFTs, and the second scan line driver circuit 5404 generates a signal which is input to a second scan line serving as a gate wiring of the other of the two switching TFTs; however, one scan line driver circuit may generate both the signal which is input to the first scan line and the signal which is input to the second scan line. In addition, for example, there is a possibility that a plurality of scan lines used for controlling the operation of the switching element are provided in each pixel, depending on the number of the switching TFTs included in one pixel. In this case, one scan line driver circuit may generate all signals that are input to the plurality of scan lines, or a plurality of scan line driver circuits may generate signals that are input to the plurality of scan lines.

Also in the light-emitting display device, a part of a driver circuit that can include an n-channel TFT among driver circuits can be formed over the same substrate as the thin film transistor of the pixel portion. Alternatively, the signal line driver circuit and the scan line driver circuit can be formed using only the n-channel TFTs described in Embodiment 1 to 7.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizer or a counter substrate, which is required in a liquid crystal display device, and both the thickness and weight of the electrophoretic display device can be reduced to a half of those of a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, when a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained by the thin film transistors formed in accordance with Embodiments 1 to 7 can be used. Each of the thin film transistors formed in accordance with Embodiments 1 to 7 includes the In—Sn—O-based oxide semiconductor layer including $SiO_X$ as the semiconductor layer including the channel formation region; and the In—Sn—O-based oxide semiconductor layer which does not include $SiO_X$, as the source and the drain region.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Through the above process, a highly reliable display device can be manufactured as a semiconductor device.

This embodiment can be implemented in appropriate combination with any of the structures described in the other embodiments.

[Embodiment 9]

When a thin film transistor is manufactured and used for a pixel portion and further for a driver circuit, a semiconductor device having a display function (also referred to as a display device) can be manufactured. Furthermore, when a part or whole of a driver circuit using a thin film transistor is formed over the same substrate as that for a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The present invention also relates to an element substrate, which corresponds to one mode before the display element is completed in a manufacturing process of the display device, and the element substrate is provided with means for supplying current to the display element in each of a plurality of pixels.

Note that a display device in this specification means an image display device, a display device, or a light source (including a lighting device). Furthermore, the display device also includes the following modules in its category: a module to which a connector such as an FPC (flexible printed circuit), a TAB (tape automated bonding) tape, or a TCP (tape carrier package) is attached; a module having a TAB tape or a TCP at the tip of which a printed wiring board is provided; and a module in which an IC (integrated circuit) is directly mounted on a display element by a COG (chip on glass) method.

The appearance and a cross section of a liquid crystal display panel, which is one embodiment of a semiconductor device, will be described with reference to FIGS. 22A1, 22A2, and 22B. FIGS. 22A1 and 22A2 are each a plan view of a panel in which thin film transistors 4010 and 4011 described in Embodiment 1 which are formed over a first substrate 4001, and a liquid crystal element 4013 are sealed between the first substrate 4001 and a second substrate 4006 with a sealant 4005. The thin film transistors 4010 and 4011 each include an In—Sn—O-based oxide semiconductor layer including $SiO_X$ as a semiconductor layer including a channel formation region; and an In—Sn—O-based oxide semiconductor layer which does not include $SiO_X$, as a source region and a drain region. FIG. 22B is a cross-sectional view taken along line M-N of FIGS. 22A1 and 22A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 22A1 illustrates an example of mounting the signal line driver circuit 4003 by a COG method, and FIG. 22A2 illustrates an example of mounting the signal line driver circuit 4003 by a TAB method.

The pixel portion 4002 and the scan line driver circuit 4004 provided over the first substrate 4001 each include a plurality of thin film transistors. FIG. 22B illustrates the thin film transistor 4010 included in the pixel portion 4002 and the thin film transistor 4011 included in the scan line driver circuit 4004.

As each of the thin film transistors 4010 and 4011, the thin film transistor described in Embodiment 1 can be used. The thin film transistor described in Embodiment 1 includes an In—Sn—O-based oxide semiconductor layer including $SiO_X$ as a semiconductor layer including a channel formation region; and an In—Sn—O-based oxide semiconductor layer which does not include $SiO_X$, as a source region and a drain region. Alternatively, the thin film transistor described in any of Embodiments 2 to 7 may be employed. In this embodiment, the thin film transistors 4010 and 4011 are n-channel thin film transistors.

In addition, the liquid crystal element 4013 includes an In—Sn—O-based oxide semiconductor layer 4030 which does not include $SiO_X$, as a pixel electrode layer. The In—Sn—O-based oxide semiconductor layer 4030 which does not include $SiO_X$ also functions as a source region or a drain region of the thin film transistor 4010 and electrically connects the thin film transistor 4010 and the liquid crystal element 4013. A counter electrode layer 4031 of the liquid crystal element 4013 is formed on the second substrate 4006. A portion where the In—Sn—O-based oxide semiconductor layer 4030 which does not include $SiO_X$ and the counter electrode layer 4031 overlap with each other corresponds to the liquid crystal element 4013. Note that the In—Sn—O-based oxide semiconductor layer 4030 which does not include $SiO_X$ and the counter electrode layer 4031 are respectively provided with an insulating layer 4032 and an insulating layer 4033 which function as alignment films. The liquid crystal layer 4008 is interposed between the In—Sn—O-based oxide semiconductor layer 4030 which does not include $SiO_X$ and the counter electrode layer 4031 with the insulating layers 4032 and 4033 interposed between the In—Sn—O-based oxide semiconductor layer 4030 which does not include $SiO_X$ and the counter electrode layer 4031.

Note that the first substrate 4001 and the second substrate 4006 can be made of glass, metal (typically, stainless steel), ceramic, or plastic. As plastic, an FRP (fiberglass-reinforced plastics) plate, a PVF (polyvinyl fluoride) film, a polyester film, or an acrylic resin film can be used. Alternatively, a sheet with a structure in which an aluminum foil is sandwiched between PVF films or polyester films can be used.

A columnar spacer denoted by reference numeral 4035 is obtained by selective etching of an insulating film and is provided in order to control the distance (a cell gap) between the In—Sn—O-based oxide semiconductor layer 4030 which does not include $SiO_X$ and the counter electrode layer 4031. Note that a spherical spacer may also be used. The counter electrode layer 4031 is electrically connected to a common potential line provided over the same substrate as the thin film transistor 4010. With the use of a common connection portion, the counter electrode layer 4031 can be electrically connected to the common potential line through conductive particles provided between the pair of substrates. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while the temperature of cholesteric liquid crystal is increased. Since the blue phase is only generated within a narrow range of temperatures, a liquid crystal composition containing a chiral agent at 5 wt % or more is used for the liquid crystal layer 4008 in order to broaden the temperature range. The liquid crystal composition which includes a liquid crystal showing a blue phase and a chiral agent has a short response time of 10 µs to 100 µs, has optical isotropy which makes the alignment process unneeded, and has a small viewing angle dependence.

An embodiment of the present invention can also be applied to a reflective liquid crystal display device or a semi-transmissive liquid crystal display device, in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stack structure of the polarizing plate and the coloring layer is not limited to that described in this embodiment and may be set as appropriate depending on materials of the polarizing plate and the coloring layer or conditions of manufacturing steps. Furthermore, a light-blocking film functioning as a black matrix may be provided.

In addition, in order to reduce the surface roughness of the thin film transistor and improve the reliability of the thin film transistor, an insulating layer functioning as a planarization film or a protective film may be formed over the thin film transistor. Note that the protective film is provided to prevent entry of impurities contained in the air, such as an organic substance, a metal substance, or water vapor, and is preferably a dense film. The protective film may be formed by a sputtering method to be a single layer or a stacked layer using any of a silicon oxide film, a silicon nitride film, a silicon oxynitride film, a silicon nitride oxide film, an aluminum oxide film, an aluminum nitride film, an aluminum oxynitride film, and an aluminum nitride oxide film. Although an example in which the protective film is formed by a sputtering method is described in this embodiment, an embodiment of the present invention is not limited to this method and a variety of methods may be employed.

Here, the insulating layer 4020 having a stack structure is formed as the protective film. As a first layer of the insulating layer 4020, a silicon oxide film is formed by a sputtering method. The use of the silicon oxide film as the protective film has the effect of preventing a hillock of an aluminum film used for the source and drain electrode layers.

In addition, an insulating layer is formed as a second layer of the protective film. In this embodiment, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electric characteristics of the TFT.

As the planarization insulating film, an organic material such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like.

Note that a siloxane resin is a resin formed from a siloxane material as a starting material and having a Si—O—Si bond. As a substituent, an organic group (e.g., an alkyl group or an aryl group) or a fluoro group may be used. The organic group may include a fluoro group.

There is no particular limitation on the method for forming the planarization insulating film, and the planarization insulating film can be formed, depending on the material, by using a sputtering method, an SOG method, a spin coating method, a dipping method, a spray coating method, a droplet discharge method (e.g., an inkjet method, screen printing, offset printing, or the like), a doctor knife, a roll coater, a curtain coater, a knife coater, or the like.

The counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the counter electrode layer 4031. The pixel electrode made of the conductive composition preferably has a sheet resistance of 10000 ohms per square or less and a transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and potentials are supplied to the signal line driver circuit 4003 that is formed separately, and the scan line driver circuit 4004 or the pixel portion 4002 from an FPC 4018.

A terminal electrode 4016 is formed from the same conductive film as source wiring layers of the thin film transistors 4010 and 4011.

The terminal electrode 4016 is electrically connected to a terminal included in the FPC 4018 through an anisotropic conductive film 4019.

Note that FIGS. 22A1, 22A2, and 22B illustrate an example in which the signal line driver circuit 4003 is formed separately and mounted on the first substrate 4001; however, the present invention is not limited to this structure. The scan line driver circuit may be separately formed and then mounted, or only a part of the signal line driver circuit or a part of the scan line driver circuit may be separately formed and then mounted.

Figure 23:
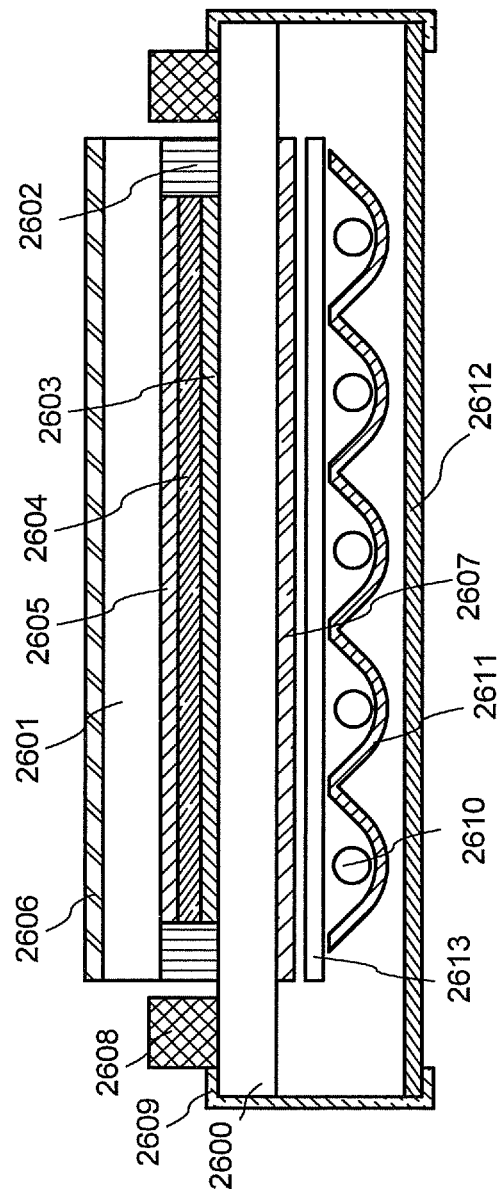
FIG. 23 illustrates a semiconductor device.

FIG. 23 illustrates an example of a liquid crystal display module which is formed as a semiconductor device by using a TFT substrate 2600 manufactured according to a manufacturing method disclosed in this specification.

FIG. 23 illustrates an example of a liquid crystal display module, in which a TFT substrate 2600 and a counter substrate 2601 are bonded to each other with a sealant 2602, and a pixel portion 2603 including a TFT or the like, a display element 2604 including a liquid crystal layer, a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a highly reliable liquid crystal display panel can be manufactured as a semiconductor device.

This embodiment can be implemented in appropriate combination with any of the structures described in the other embodiments.

[Embodiment 10]

An example of electronic paper will be described as a semiconductor device.

Figure 30:
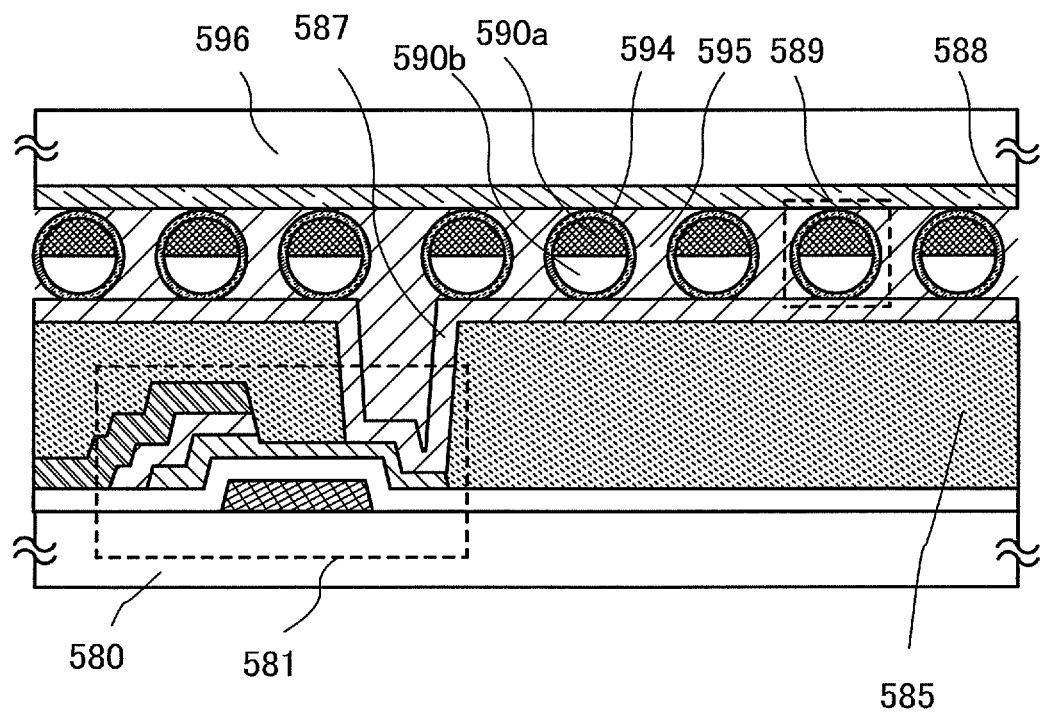
FIG. 30 illustrates a semiconductor device.

FIG. 30 illustrates active matrix electronic paper as an example of a semiconductor device. A thin film transistor 581 used for the semiconductor device can be manufactured in a manner similar to that of the thin film transistor described in Embodiment 1 and is a thin film transistor which includes an In—Sn—O-based oxide semiconductor layer including $SiO_X$ as a semiconductor layer including a channel formation region; and an In—Sn—O-based oxide semiconductor layer which does not include $SiO_X$, as a source region and a drain region. The thin film transistor described in Embodiments 2 to 7 can also be used as the thin film transistor 581 of this embodiment.

The twisting ball display system refers to a method in which spherical particles each colored in black or white are arranged between electrode layers which are used for a display element, and a potential difference is generated between the electrode layers to control orientation of the spherical particles, so that display is performed.

The thin film transistor 581 provided over a substrate 580 is a bottom-gate thin film transistor, and is in contact with an In—Sn—O-based oxide semiconductor layer 587 which does not include $SiO_X$ and functions as a source region or a drain region and a pixel electrode layer through an opening formed in insulating layers 585, whereby the thin film transistor 581 is electrically connected to the In—Sn—O-based oxide semiconductor layer 587. Between the In—Sn—O-based oxide semiconductor layer 587 which does not include $SiO_X$ and an electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 30). The electrode layer 588 corresponds to a common electrode (counter electrode). The electrode layer 588 is electrically connected to a common potential line provided over the same substrate as that for the thin film transistor 581. With the use of a common connection portion, the electrode layer 588 can be electrically connected to the common potential line through conductive particles provided between a pair of substrates.

Instead of the twisting ball, an electrophoretic element can also be used. A microcapsule having a diameter of approximately 10 μm to 20 μM, in which a transparent liquid and positively charged white microparticles and negatively charged black microparticles are encapsulated, is used. In the microcapsule which is provided between the pixel electrode layer and the common electrode layer, when an electric field is applied by the pixel electrode layer and the common electrode layer, the white microparticles and the black microparticles migrate to opposite sides to each other, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper can be manufactured as a semiconductor device.

This embodiment can be implemented in appropriate combination with any of the structures described in the other embodiments.

[Embodiment 11]

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and a current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission which utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 20:
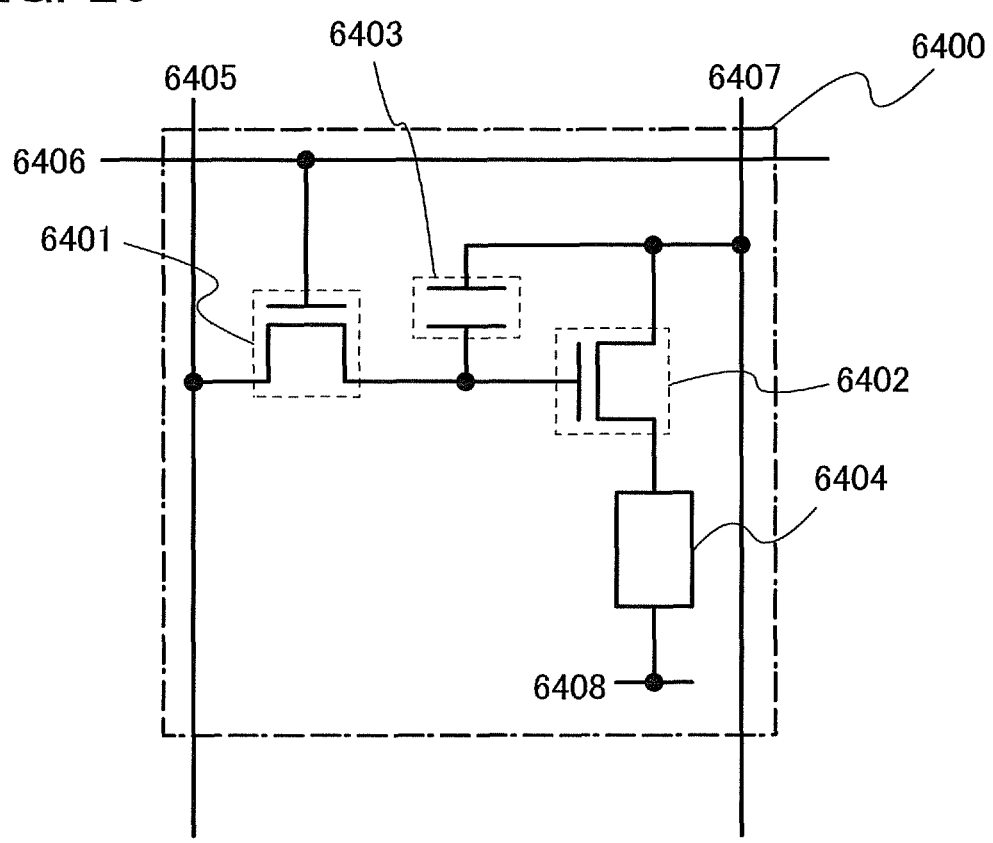
FIG. 20 illustrates a pixel equivalent circuit of a semiconductor device.

FIG. 20 illustrates an example of a pixel structure as an example of a semiconductor device which can be driven by a digital time grayscale method.

The structure and operation of a pixel which can be driven by a digital time grayscale method will be described. An example is described here in which one pixel includes two n-channel transistors each using an In—Sn—O-based oxide semiconductor layer including $SiO_X$ for a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power source line 6407 through the capacitor 6403, a first electrode of the driving transistor 6402 is connected to the power source line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (common electrode 6408) of the light-emitting element 6404 is set to be a low power source potential. The low power source potential is lower than a high power source potential which is supplied to the power source line 6407. For example, GND, 0 V, or the like may be set as the low power source potential. The difference between the high power source potential and the low power source potential is applied to the light-emitting element 6404 so that a current flows through the light-emitting element 6404, whereby the light-emitting element 6404 emits light. Thus, each potential is set so that the difference between the high power source potential and the low power source potential is greater than or equal to a forward threshold voltage of the light-emitting element 6404.

When the gate capacitance of the driving transistor 6402 is used as a substitute for the capacitor 6403, the capacitor 6403 can be omitted. The gate capacitance of the driving transistor 6402 may be formed between a channel region and a gate electrode.

Here, in the case of using a voltage-input voltage-driving method, a video signal is input to the gate of the driving transistor 6402 to make the driving transistor 6402 completely turned on or off. That is, the driving transistor 6402 operates in a linear region, and thus, a voltage higher than the voltage of the power source line 6407 is applied to the gate of the driving transistor 6402. Note that a voltage greater than or equal to (power source line voltage+$V_{th}$ of the driving transistor 6402) is applied to the signal line 6405.

In the case of using an analog grayscale method instead of the digital time grayscale method, the same pixel structure as in FIG. 20 can be employed by inputting signals in a different way.

In the case of using the analog grayscale driving method, a voltage greater than or equal to (forward voltage of the light-emitting element 6404+$V_{th}$ of the driving transistor 6402) is applied to the gate of the driving transistor 6402. The forward voltage of the light-emitting element 6404 refers to a voltage to obtain a desired luminance, and includes at least a forward threshold voltage. By inputting a video signal to enable the driving transistor 6402 to operate in a saturation region, a current can flow through the light-emitting element 6404. In order that the driving transistor 6402 can operate in the saturation region, the potential of the power source line 6407 is higher than a gate potential of the driving transistor 6402. With the analog video signal, a current in accordance with the video signal flows through the light-emitting element 6404, and the analog grayscale driving method can be performed.

Note that the pixel structure is not limited to that illustrated in FIG. 20. For example, the pixel in FIG. 20 can further include a switch, a resistor, a capacitor, a transistor, a logic circuit, or the like.

Next, structures of the light-emitting element will be described with reference to FIGS. 21A to 21C. Here, a cross-sectional structure of a pixel will be described by taking an n-channel driving TFT as an example. Driving TFTs 7001, 7011, and 7021 used for semiconductor devices illustrated in FIGS. 21A to 21C can be manufactured in a manner similar to that of the thin film transistor described in Embodiment 1 and are thin film transistors, each of which includes an In—Sn—O-based oxide semiconductor layer including $SiO_X$ as a semiconductor layer including a channel formation region; and an In—Sn—O-based oxide semiconductor layer which does not include $SiO_X$, as a source region and a drain region. Alternatively, the thin film transistor described in Embodiments 2 to 7 can be employed as the driving TFTs 7001, 7011, and 7021.

In order to extract light emitted from the light-emitting element, at least one of an anode and a cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel structure can be applied to a light-emitting element having any of these emission structures.

A light-emitting element having a top emission structure will be described with reference to FIG. 21A.

Figure 21A:
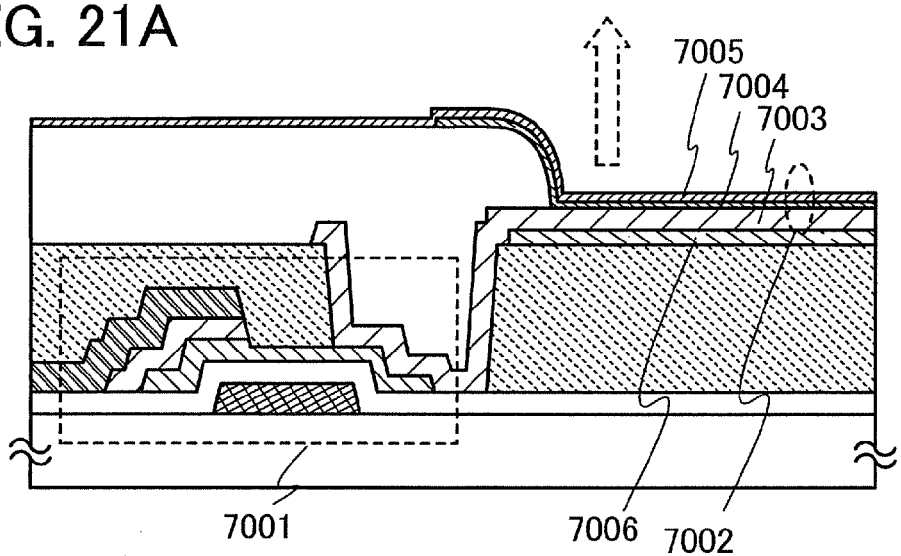
FIGS. 21A to 21C each illustrate a semiconductor device.

FIG. 21A is a cross-sectional view of a pixel in the case where the driving TFT 7001 is of an n-type and light is emitted from a light-emitting element 7002 to an anode 7005 side. In FIG. 21A, a cathode 7003 of the light-emitting element 7002 is electrically connected to the driving TFT 7001. The cathode 7003, a light-emitting layer 7004 and the anode 7005 are stacked in this order over a reflective film 7006. The cathode 7003, which is formed from an In—Sn—O-based oxide semiconductor film which does not include $SiO_X$, has both functions of a source region or a drain region and a pixel electrode layer of the TFT 7001. The cathode 7003 formed from an In—Sn—O-based oxide semiconductor film which does not include $SiO_X$ functions as an electrode of the light-emitting element 7002. The reflective film 7006 can be formed using a variety of materials as long as they reflect light. For example, Ca, Al, CaF, MgAg, AlLi, or the like can be given. The light-emitting layer 7004 may be formed with either a single layer or a stacked layer of a plurality of layers. When the light-emitting layer 7004 is formed with a plurality of layers, the light-emitting layer 7004 is formed by stacking an electron-injecting layer, an electron-transporting layer, a light-emitting layer, a hole-transporting layer, and a hole-injecting layer in this order over the cathode 7003 which is formed from the In—Sn—O-based oxide semiconductor film which does not include $SiO_X$. Note that not all of these layers need to be provided. The anode 7005 is made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 21A, light is emitted from the light-emitting element 7002 to the anode 7005 side as indicated by an arrow.

Next, a light-emitting element having a bottom emission structure will be described with reference to FIG. 21B. FIG. 21B is a cross-sectional view of a pixel in the case where the driving TFT 7011 is of an n-type and light is emitted from a light-emitting element 7012 to a cathode 7013 side. In FIG. 21B, a light-emitting layer 7014 and an anode 7015 of the light-emitting element 7012 are stacked in this order over the light-transmitting cathode 7013 formed from an In—Sn—O-based oxide semiconductor film which does not include $SiO_X$, which is electrically connected to the driving TFT 7011. The cathode 7013 formed from the In—Sn—O-based oxide semiconductor film which does not include $SiO_X$, which functions as a source region or a drain region of the driving TFT 7011 and a pixel electrode layer, functions as an electrode of the light-emitting element 7012. A blocking film 7016 for reflecting or blocking light may be formed so as to cover the anode 7015 when the anode 7015 has a light-transmitting property. For the cathode 7013, as in the case of FIG. 21A, an In—Sn—O-based oxide semiconductor material can be used. Similarly to the case of FIG. 21A, the light-emitting layer 7014 may be formed with either a single layer or a plurality of layers stacked. The anode 7015 is not required to transmit light, but can be made of a light-transmitting conductive material like in the case of FIG. 21A. For the blocking film 7016, a metal or the like that reflects light can be used; however, it is not limited to a metal film. For example, a resin or the like to which black pigments are added can be used.

A region where the light-emitting layer 7014 is sandwiched between the cathode 7013 and the anode 7015 corresponds to the light-emitting element 7012. In the case of the pixel illustrated in FIG. 21B, light is emitted from the light-emitting element 7012 to the cathode 7013 side as indicated by an arrow.

Next, a light-emitting element having a dual emission structure will be described with reference to FIG. 21C. In FIG. 21C, a light-emitting layer 7024 and an anode 7025 are stacked in this order over the light-transmitting cathode 7013 formed from an In—Sn—O-based oxide semiconductor film which does not include $SiO_X$. The cathode 7013 is electrically connected to the driving TFT 7011. For the cathode 7023, as in the case of FIG. 21A, an In—Sn—O-based oxide semiconductor material can be used. The cathode 7023 formed from the In—Sn—O-based oxide semiconductor film which does not include $SiO_X$, which functions as a source region or a drain region of the driving TFT 7021 and a pixel electrode, functions as an electrode of the light-emitting element 7022. Similar to the case of FIG. 21A, the light-emitting layer 7024 may be formed as either a single layer or a plurality of layers stacked. The anode 7025 can be formed using a light-transmitting conductive material like in the case of FIG. 21A.

The light-emitting element 7022 corresponds to a region where the cathode 7023, the light-emitting layer 7024, and the anode 7025 overlap with one another. In the case of the pixel illustrated in FIG. 21C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

Note that the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 21B:
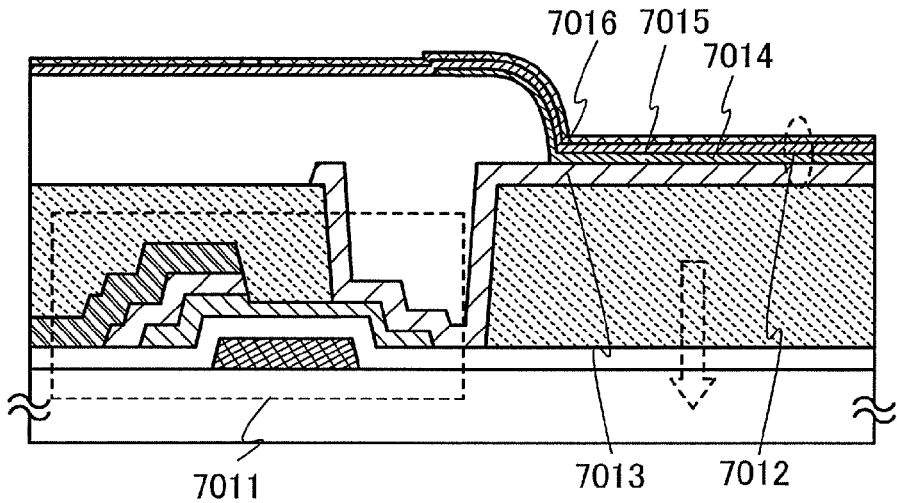
Figure 21C:
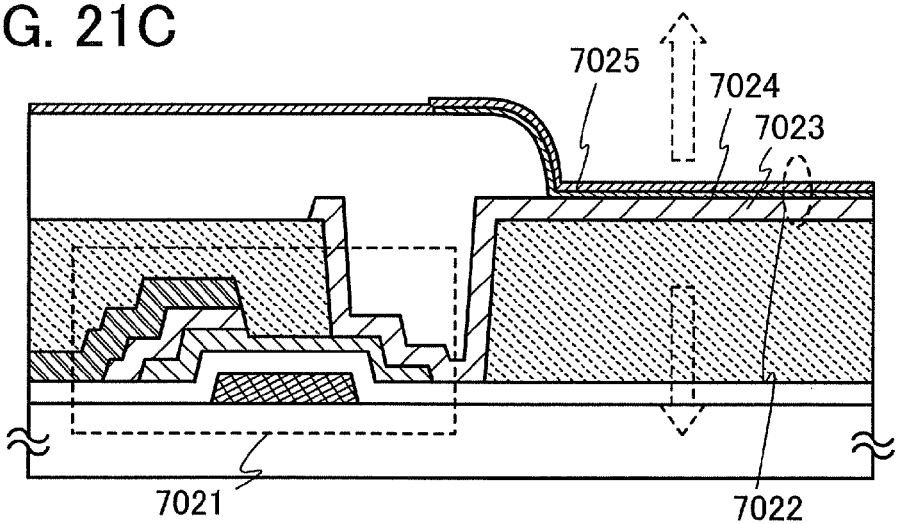

Note that the structure of the semiconductor device is not limited to those illustrated in FIGS. 21A to 21C and can be modified in various ways based on techniques disclosed in this specification.

Figure 24A:
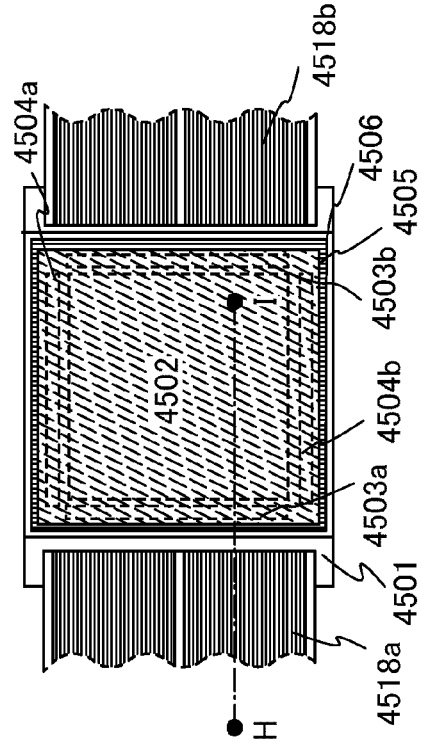
FIGS. 24A and 24B illustrate a semiconductor device.
Figure 24B:
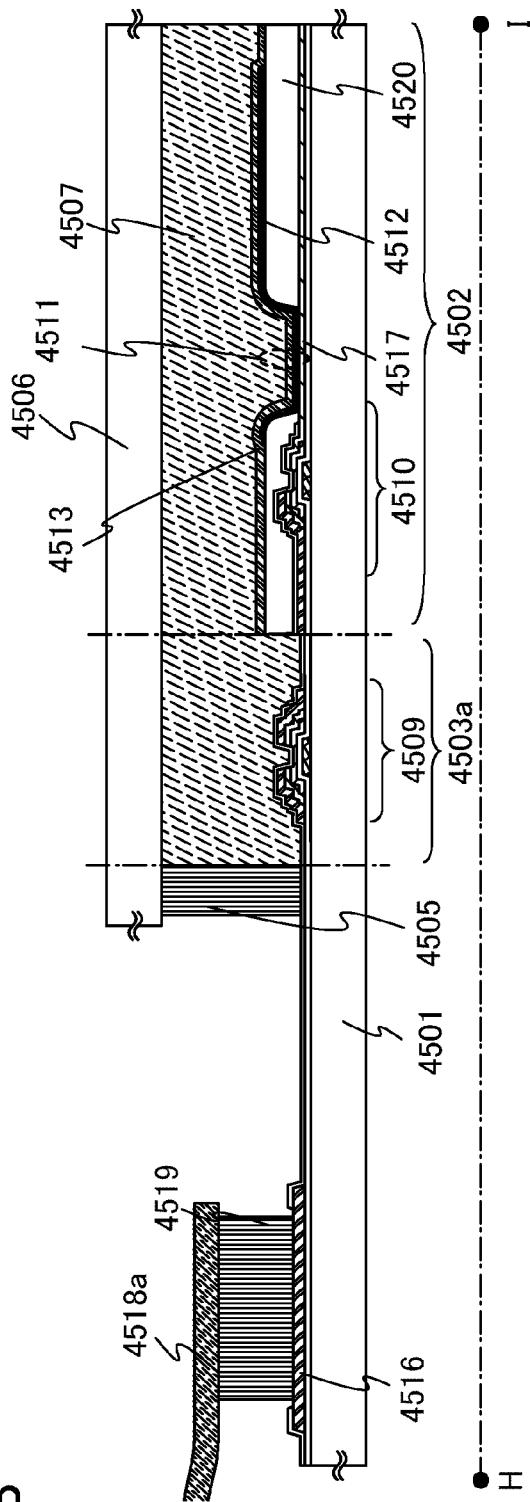

Next, the appearance and a cross section of a light-emitting display panel (also referred to as a light-emitting panel), which is one embodiment of the semiconductor device, will be described with reference to FIGS. 24A and 24B. FIG. 24A is a top view of a panel in which a thin film transistor and a light-emitting element formed over a first substrate are sealed between the first substrate and a second substrate with a sealant. FIG. 24B is a cross-sectional view along line H-I of FIG. 24A.

A sealant 4505 is provided to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 24B.

As each of the thin film transistors 4509 and 4510, the thin film transistor described in Embodiment 1, includes an In—Sn—O-based oxide semiconductor layer including $SiO_X$ as a semiconductor layer including a channel formation region; and an In—Sn—O-based oxide semiconductor layer which does not include $SiO_X$, as a source region and a drain region, can be used. Alternatively, the thin film transistor described in any of Embodiments 2 to 7 may be employed. The thin film transistors 4509 and 4510 are n-channel thin film transistors.

In addition, the light-emitting layer 4511 includes an In—Sn—O-based oxide semiconductor layer 4517 which does not include $SiO_X$ and functions as a pixel electrode layer. The In—Sn—O-based oxide semiconductor layer 4030 which does not include $SiO_X$ also functions as a source region or a drain region of the thin film transistor 4510 and electrically connects the thin film transistor 4510 and the light-emitting element 4511. Note that the structure of the light-emitting element 4511 is, but not limited to, the stack structure which includes the In—Sn—O-based oxide semiconductor layer 4517 which does not include $SiO_X$, an electroluminescent layer 4512, and the electrode layer 4513. The structure of the light-emitting element 4511 can be changed as appropriate depending on the direction in which light is extracted from the light-emitting element 4511, or the like.

A partition wall 4520 is made of an organic resin film, an inorganic insulating film, or organic polysiloxane. It is particularly preferable that the partition wall 4520 be formed of a photosensitive material to have an opening over the In—Sn—O-based oxide semiconductor layer 4517 which does not include $SiO_X$ so that a sidewall of the opening is formed as an inclined surface with continuous curvature.

The electroluminescent layer 4512 may be formed as a single layer or a plurality of layers stacked.

A protective film may be formed over the electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

A terminal electrode 4516 is formed from the same conductive film as source wirings of the thin film transistors 4509 and 4510.

The terminal electrode 4516 is electrically connected to a terminal of the FPC 4518*a* through an anisotropic conductive film 4519.

In the case where the first substrate 4501 and/or the second substrate 4506 is located in the direction in which light is extracted from the light-emitting element 4511, the first substrate 4501 and/or the second substrate 4506 need/needs to have a light-transmitting property. In that case, a material with a light-transmitting property, such as a glass plate, a plastic sheet, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 24A and 24B.

Through the above process, a highly reliable light-emitting display device (display panel) can be manufactured as a semiconductor device.

This embodiment can be implemented in appropriate combination with any of the structures described in the other embodiments.

[Embodiment 12]

A semiconductor device disclosed in this specification can be applied to electronic paper. Electronic paper can be used for electronic appliances of a variety of fields as long as they display data. For example, electronic paper can be applied to an electronic book device (electronic book), a poster, an advertisement in a vehicle such as a train, or displays of various cards such as a credit card. Examples of the electronic appliances are illustrated in FIGS. 25A and 25B and FIG. 26.

Figure 25A:
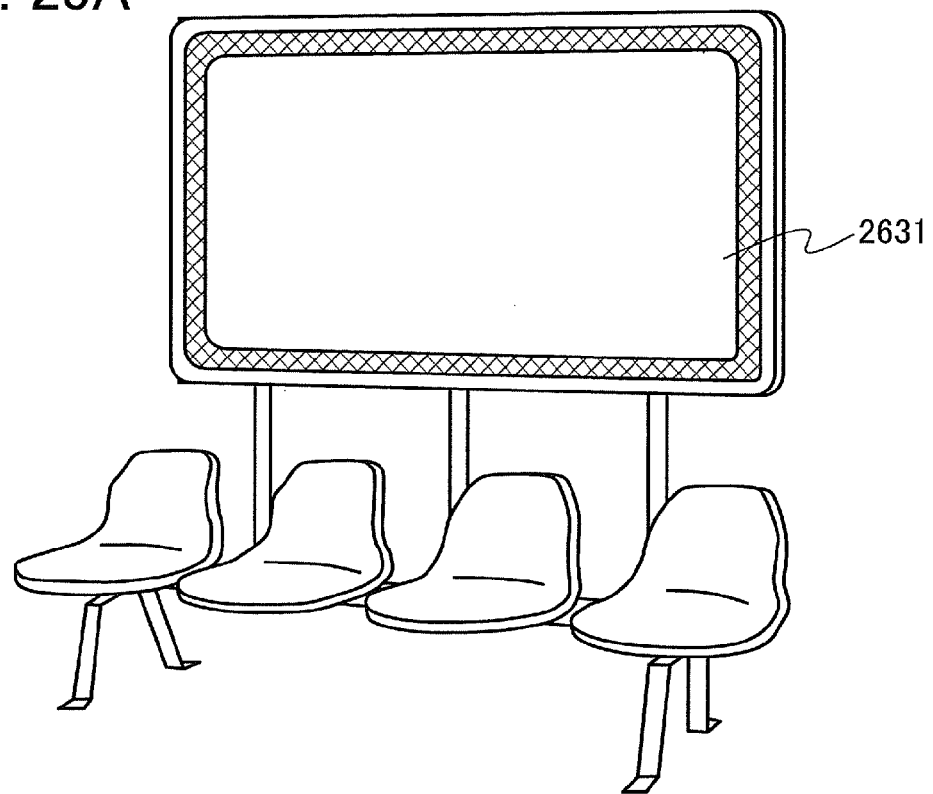
FIGS. 25A and 25B each illustrate an example of a usage pattern of an electronic paper.

FIG. 25A illustrates a poster 2631 using electronic paper. In the case where an advertising medium is printed paper, the advertisement is replaced by hands; however, by using electronic paper disclosed in this specification, the advertising display can be changed in a short time. Furthermore, stable images can be obtained without display defects. Note that the poster may have a configuration capable of wirelessly transmitting and receiving data.

Figure 25B:
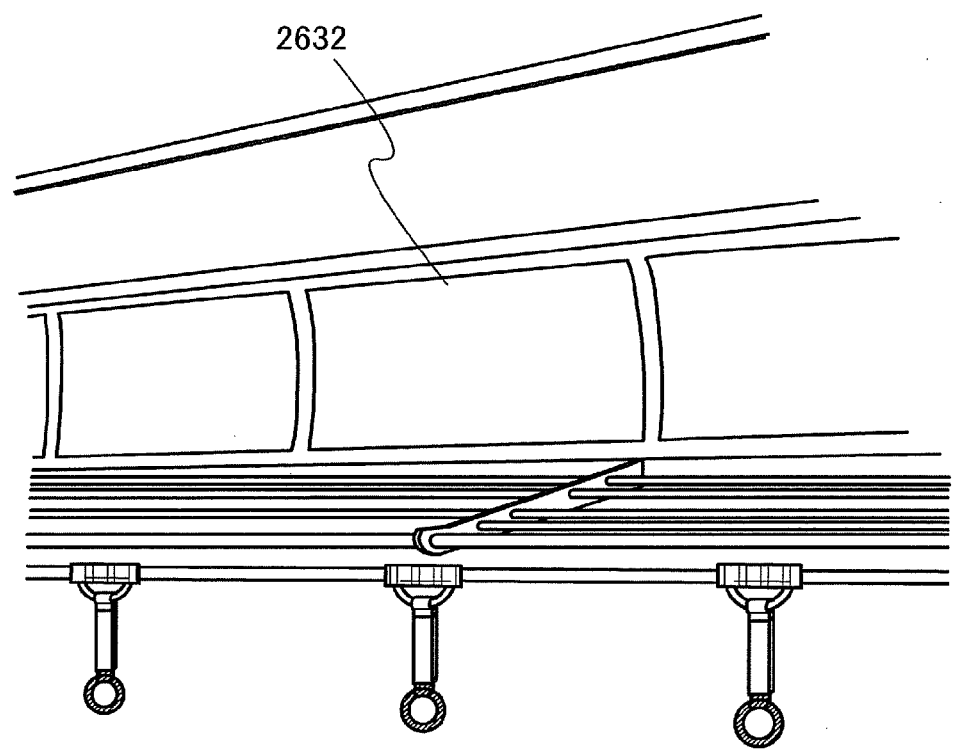

FIG. 25B illustrates an advertisement 2632 in a vehicle such as a train. In the case where an advertising medium is printed paper, the advertisement is replaced by hands; however, by using electronic paper disclosed in this specification, the advertising display can be changed in a short time with less manpower. Furthermore, stable images can be obtained without display defects. Note that the advertisement in a vehicle may have a configuration capable of wirelessly transmitting and receiving data.

Figure 26:
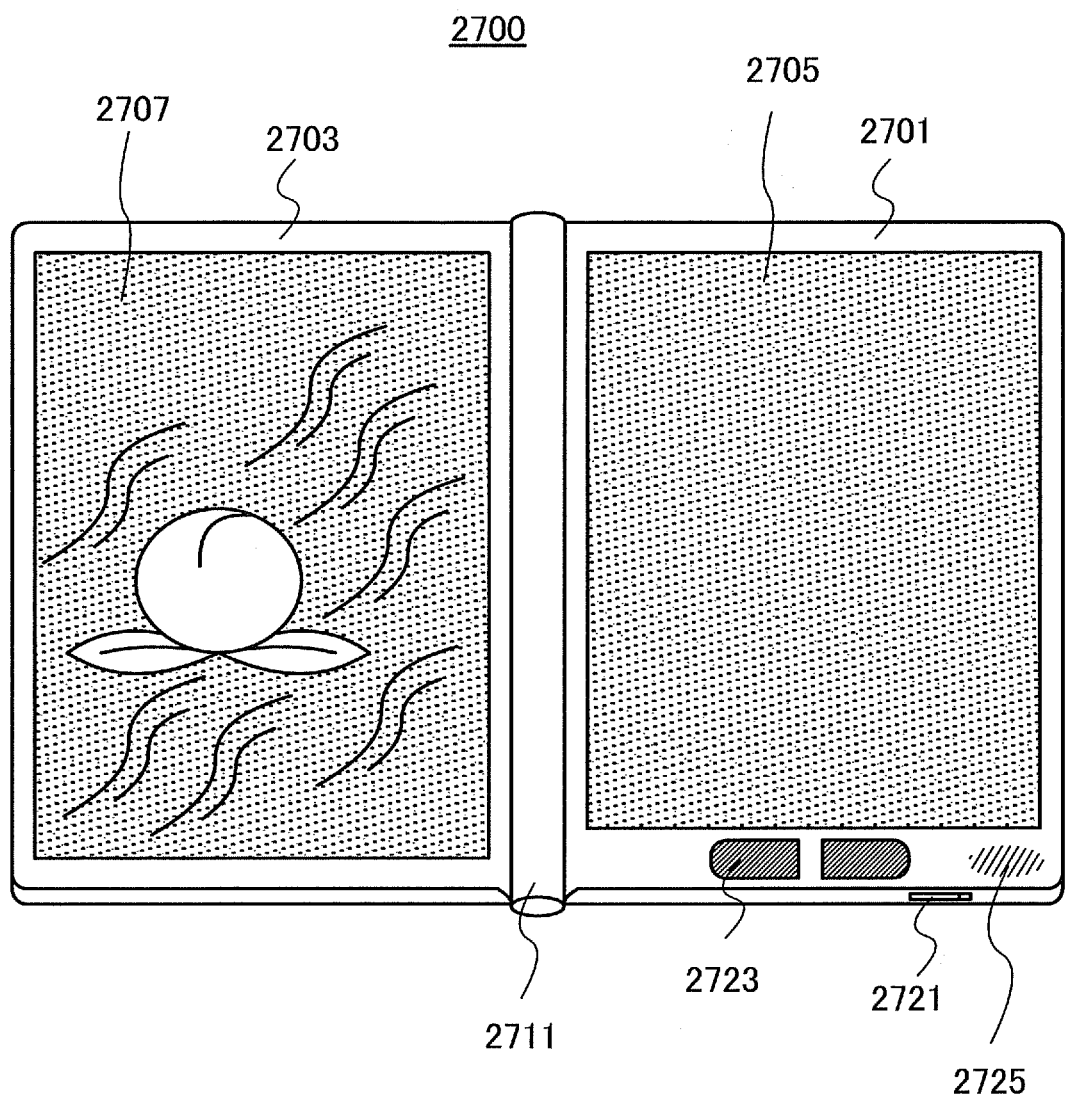
FIG. 26 is an external view of an example of an electronic book reader.

FIG. 26 illustrates an example of an electronic book device 2700. For example, the electronic book device 2700 includes two housings, a housing 2701 and a housing 2703. The housing 2701 and the housing 2703 are combined with a hinge 2711 so that the electronic book device 2700 can be opened and closed with the hinge 2711 as an axis. With such a structure, the electronic book device 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 26) and graphics can be displayed on a display portion on the left side (the display portion 2707 in FIG. 26).

FIG. 26 illustrates an example in which the housing 2701 is provided with an operation portion and the like. For example, the housing 2701 is provided with a power switch 2721, an operation key 2723, a speaker 2725, and the like. With the operation key 2723, pages can be turned. A keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book device 2700 may have a function of an electronic dictionary.

The electronic book device 2700 may have a configuration capable of wirelessly transmitting and receiving data. Through wireless communication, desired book data or the like can be purchased and downloaded from an electronic book server.

[Embodiment 13]

A semiconductor device disclosed in this specification can be applied as a variety of electronic appliances (including amusement machines). Examples of electronic appliances include television sets (also referred to as televisions or television receivers), monitor of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 27A:
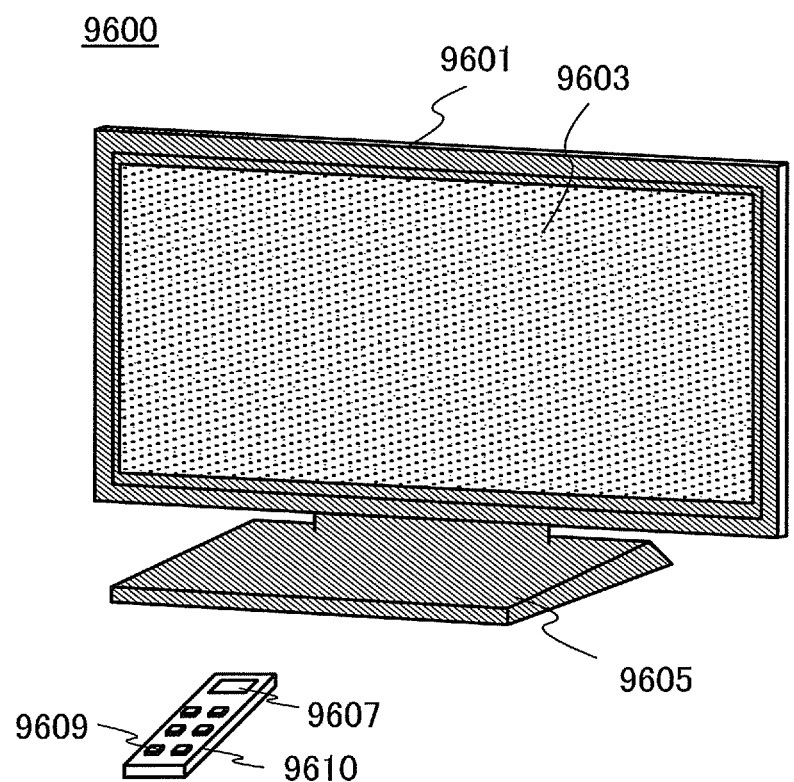
FIG. 27A is an external view of an example of a television device and FIG. 27B is an external view of an example of a digital photo frame.

FIG. 27A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 27B:
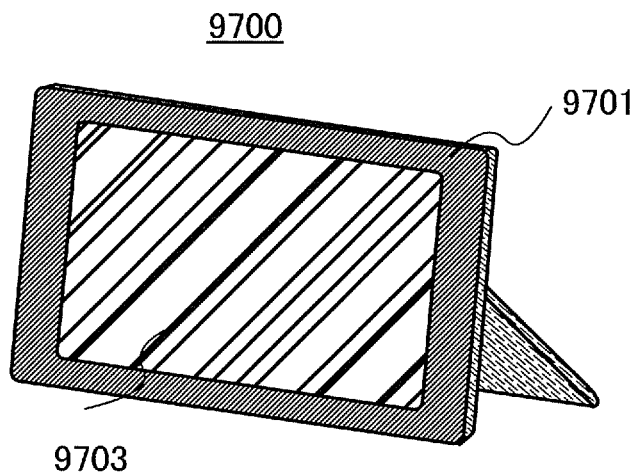

FIG. 27B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may have a configuration capable of wirelessly transmitting and receiving data. Through wireless communication, desired image data can be transferred to be displayed.

Figure 28A:
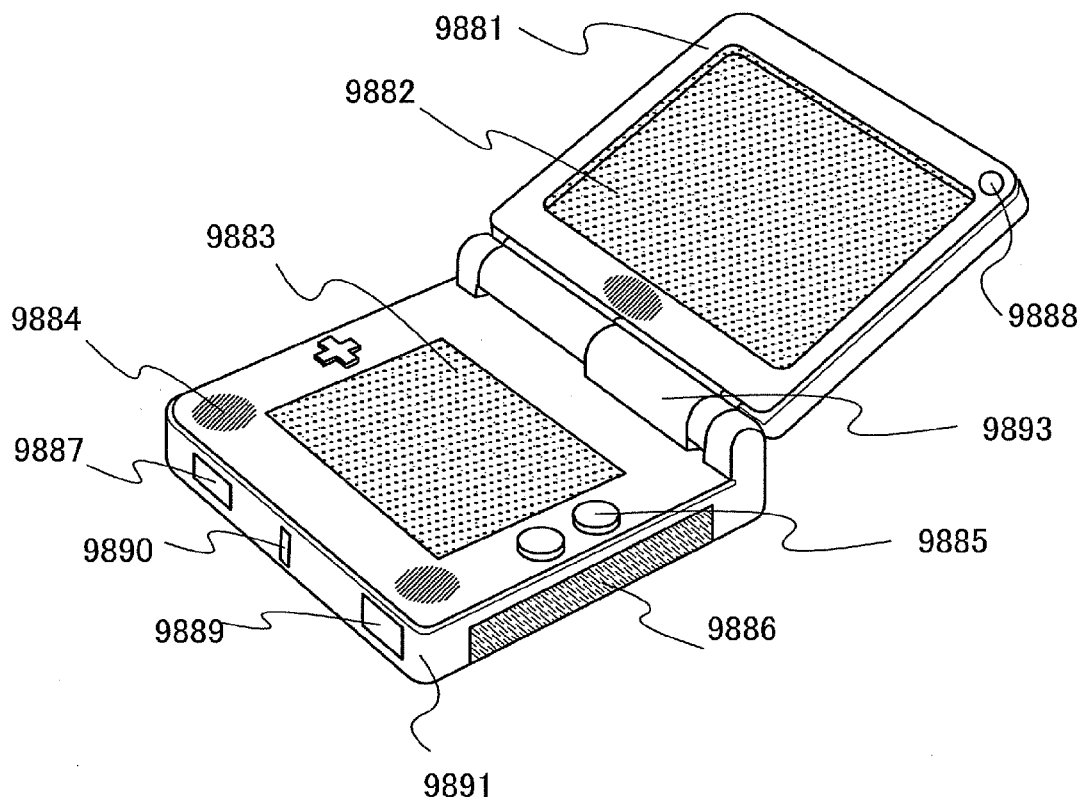
FIGS. 28A and 28B each illustrate an example of an amusement machine.

FIG. 28A illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 28A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device disclosed in this specification can be employed. The portable amusement machine may include other accessory equipment as appropriate. The portable amusement machine illustrated in FIG. 28A has a function of reading a program or data stored in a recording medium to display it on the display portion, and a function of sharing information with another portable amusement machine by wireless communication. The portable amusement machine illustrated in FIG. 28A can have various functions without limitation to the above.

Figure 28B:
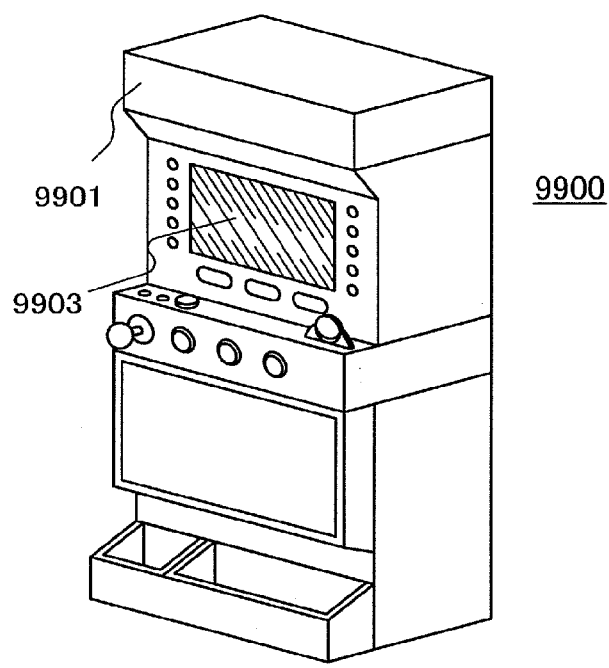

FIG. 28B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 may include other accessory equipment as appropriate.

Figure 29A:
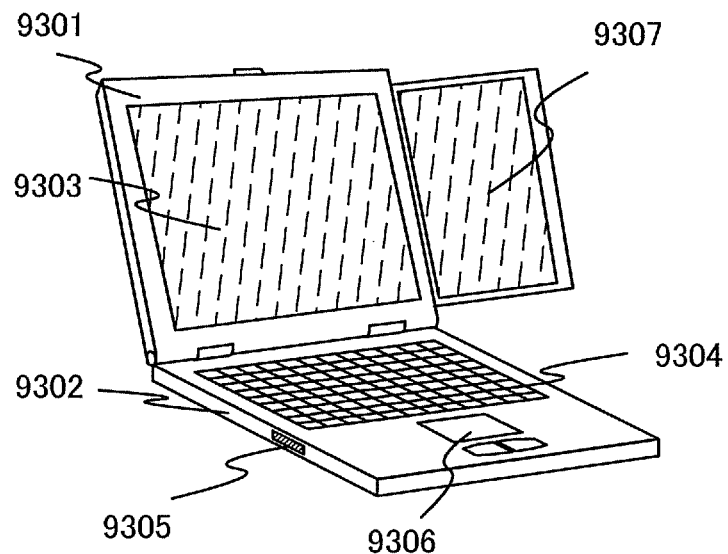
FIGS. 29A and 29B each illustrate an example of a mobile phone.

FIG. 29A is a perspective view illustrating an example of a portable computer.

In the portable computer of FIG. 29A, a top housing 9301 having a display portion 9303 and a bottom housing 9302 having a keyboard 9304 can overlap with each other by closing a hinge unit which connects the top housing 9301 and the bottom housing 9302. The portable computer of FIG. 29A can be convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301, which includes a display portion 9307 and can keep the display portion 9307 therein by sliding it toward the inside of the top housing 9301, can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed using an image display device of a liquid crystal display panel, a light-emitting display panel such as an organic light-emitting element or an inorganic light-emitting element, or the like.

In addition, the portable computer of FIG. 29A can be provided with a receiver and the like and can receive a television broadcast to display an image on the display portion. The user can watch a television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying a television broadcast is performed. Therefore, power can be consumed to the minimum, which is useful for the portable computer whose battery capacity is limited.

Figure 29B:
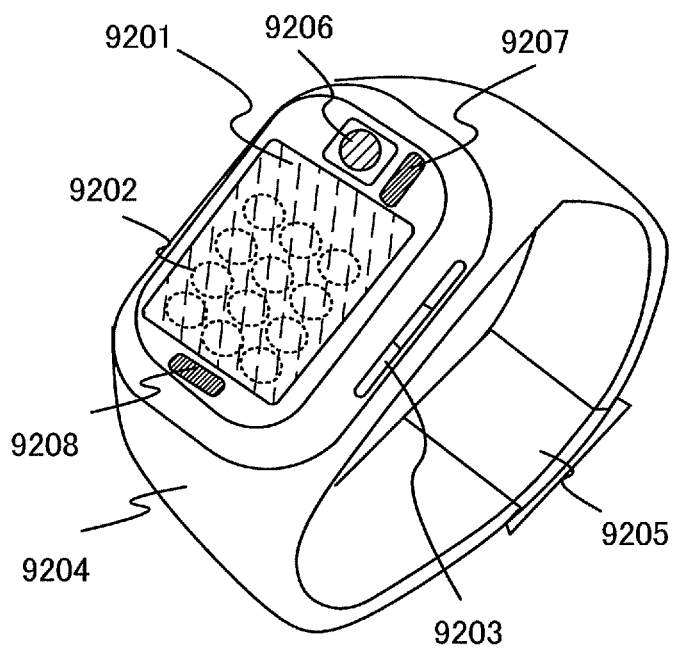

FIG. 29B is a perspective view illustrating an example of a cellular phone that the user can wear on the wrist like a wristwatch.

This cellular phone is formed with a main body which includes a communication device including at least a telephone function, and battery; a band portion which enables the main body to be wore on the wrist; an adjusting portion 9205 for adjusting the fixation of the band portion fixed for the wrist; a display portion 9201; a speaker 9207; and a microphone 9208.

In addition, the main body includes operating switches 9203. The operating switches 9203 serve, for example, as a switch for starting a program for the Internet when the switch is pushed, in addition to serving as a switch for turning on a power source, a switch for shifting a display, a switch for instructing to start taking images, or the like, and can be used so as to correspond to each function.

Input to this cellular phone is operated by touching the display portion 9201 with a finger or an input pen, operating the operating switches 9203, or inputting voice into the microphone 9208. Note that displayed buttons 9202 which are displayed on the display portion 9201 are illustrated in FIG. 29B. Input can be performed by touching the displayed buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The cellular phone illustrated in FIG. 29B is provided with a receiver of a television broadcast and the like, and can display an image on the display portion 9201 by receiving a television broadcast. In addition, the cellular phone illustrated in FIG. 29B is provided with a memory device and the like such as a memory, and can record a television broadcast in the memory. The cellular phone illustrated in FIG. 29B may have a function of collecting location information such as GPS.

An image display device of a liquid crystal display panel, a light-emitting display panel such as an organic light-emitting element or an inorganic light-emitting element, or the like is used as the display portion 9201. The cellular phone illustrated in FIG. 29B is compact and lightweight and the battery capacity of the cellular phone illustrated in FIG. 29B is limited. Therefore, a panel which can be driven with low power consumption is preferably used as a display device for the display portion 9201.

Note that FIG. 29B illustrates the electronic apparatus which is worn on the wrist; however, this embodiment is not limited thereto as long as a portable shape is employed.

EXAMPLE 1

An In—Sn—O-based oxide semiconductor film including $SiO_X$ used for a semiconductor layer included in a channel formation region of a thin film transistor was formed. The detailed description thereof is given below.

Samples A, B, and C each of which was an In—Sn—O-based oxide semiconductor film including $SiO_2$ were formed by a sputtering method using an In—Sn—O-based oxide semiconductor target including $SiO_2$ ($In_2O_3$:$SnO_2$:$SiO_2$= 85:10:5 (wt %)) and the conductivity thereof was measured. The formation conditions and the conductivity of the samples A, B, and C are shown in Table 1.

TABLE 1

| | | SAMPLE NAME | | |
|---|---|---|---|---|
| | | SAMPLE A | SAMPLE B | SAMPLE C |
| FORMATION CONDITOINS | POWER SUPPLY [kW] | 3.2 | 3.2 | 3.2 |
| | PRESSURE [Pa] | 0.16 | 0.23 | 0.15 |
| | FLOW RATE OF ARGON [sccm] | 72 | 50 | 30 |
| | FLOW RATE OF OXYGEN [sccm] | 3 | 20 | 20 |
| | PROPORTION OF OXYGEN FLOW RATE [%] | 4 | 29 | 40 |
| CONDUCTIVITY [S/cm] | | 4.20E+01 | 3.76E−07 | 9.25E−10 |

In Table 1, the proportion of an oxygen flow rate is obtained by dividing an oxygen flow rate flowing at the time of film formation by the whole flow rate of oxygen flow and argon. As shown in Table 1, the conductivity of the sample A formed at 4% of the oxygen flow rate was 4.20 E+01(4.20×10) S/cm, the conductivity of the sample B formed at 29% of the oxygen flow rate was 3.76 E−07($3.73\times10^{-7}$) S/cm, and the conductivity of the sample C formed at 40% of the oxygen flow rate was 9.25 E−10($9.25\times10^{-10}$) S/cm.

According to the above results of computation, as for the thin film transistor in which an In—Sn—O-based oxide semiconductor layer including $SiO_X$ is used as a semiconductor layer including a channel formation region, the semiconductor layer preferably has a conductivity less than or equal to $1.6\times10^{-3}$ S/cm, or more preferably less than or equal to $1.3\times10^{-4}$ S/cm.

Thus, since the In—Sn—O-based oxide semiconductor films including $SiO_2$ of the sample B and the sample C each has a low conductivity of less than or equal to $1.3\times10^{-4}$ S/cm, a thin film transistor having excellent electrical characteristics can be manufactured using the In—Sn—O-based oxide semiconductor film including $SiO_2$ of the sample B or the sample C.

This application is based on Japanese Patent Application serial no. 2009-026482 filed with Japan Patent Office on Feb. 6, 2009, the entire contents of which are hereby incorporated by reference.

What is claimed is:

1. A method of manufacturing a semiconductor device, comprising:
    forming a gate electrode layer over a substrate having an insulating surface;
    forming a gate insulating layer over the gate electrode layer;
    forming a first oxide semiconductor layer including In and $SiO_X$ over the gate insulating layer by a sputtering method using a first oxide semiconductor target including $SiO_2$ at 5 wt % or higher and 50 wt % or lower; and forming a source region, a drain region, and a pixel electrode over the first oxide semiconductor layer by a sputtering method using a second oxide semiconductor target including In, Si and O, wherein the source region, the drain region, and the pixel electrode are formed from a second oxide semiconductor layer including In and O.

2. A method of manufacturing a semiconductor device according to claim 1, wherein a channel region is formed in the first oxide semiconductor layer.

3. A method of manufacturing a semiconductor device, comprising:

forming a gate electrode layer over a substrate having an insulating surface;

forming a gate insulating layer over the gate electrode layer;

forming a first oxide semiconductor layer including In over the gate insulating layer by a sputtering method using a first target including In and O; and forming a source region, a drain region, and a pixel electrode over the first oxide semiconductor layer by a sputtering method using a second target including In and O, wherein the source region, the drain region, and the pixel electrode are formed from a second oxide semiconductor layer including In, N, and O.

4. The method of manufacturing a semiconductor device according to claim 3, wherein a channel region is formed in the first oxide semiconductor layer.

5. The method of manufacturing a semiconductor device according to claim 3, the first oxide semiconductor layer further including Sn.

6. The method of manufacturing a semiconductor device according to claim 3, the first oxide semiconductor layer further including Si.

7. The method of manufacturing a semiconductor device according to claim 3, the second oxide semiconductor layer further including Sn.

8. A method of manufacturing a semiconductor device, comprising:

forming a gate electrode layer over a substrate having an insulating surface;

forming a gate insulating layer over the gate electrode layer;

forming a first oxide semiconductor layer including In and Si over the gate insulating layer by a sputtering method using a first target including In, Si, and O where a concentration of $SiO_2$ is 5 wt % or higher and 50 wt % or lower; and forming a source region, a drain region, and a pixel electrode over the first oxide semiconductor layer by a sputtering method using a second target including In and O, wherein the source region, the drain region, and the pixel electrode are formed from a second oxide semiconductor layer including In and O.

9. The method of manufacturing a semiconductor device according to claim 8, wherein a channel region is formed in the first oxide semiconductor layer.

10. The method of manufacturing a semiconductor device according to claim 8, the first oxide semiconductor layer further including Sn.

11. The method of manufacturing a semiconductor device according to claim 8, the first oxide semiconductor layer further including Si.

12. The method of manufacturing a semiconductor device according to claim 8, the second oxide semiconductor layer further including Sn.

13. A method of manufacturing a semiconductor device according to claim 1, wherein the first oxide semiconductor target further includes Sn.

14. A method of manufacturing a semiconductor device according to claim 1, wherein the-second oxide semiconductor target further includes Sn.

* * * * *

UNITED STATES PATENT AND TRADEMARK OFFICE
CERTIFICATE OF CORRECTION

PATENT NO. : 8,877,569 B2  
APPLICATION NO. : 13/455425  
DATED : November 4, 2014  
INVENTOR(S) : Yoshiaki Oikawa et al.

Page 1 of 1

It is certified that error appears in the above-identified patent and that said Letters Patent is hereby corrected as shown below:

In the Specification

At column 2, line 48, "Inc." should be --Inc..--;

At column 14, line 52, "at wt%" should be --at 5 wt%--;

At column 32, line 19, "20 µM," should be --20 µm,--.

Signed and Sealed this
Fourteenth Day of April, 2015

Michelle K. Lee
*Director of the United States Patent and Trademark Office*